(12) United States Patent
Uchiyama et al.

(10) Patent No.: US 6,560,007 B2
(45) Date of Patent: May 6, 2003

(54) BIT-PHASE SYNCHRONIZED OPTICAL PULSE STREAM LOCAL GENERATOR

(75) Inventors: Kentaro Uchiyama, Yokosuka (JP); Etsu Hashimoto, Tokyo (JP); Wataru Imajuku, Yokohama (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 161 days.

(21) Appl. No.: 09/761,715

(22) Filed: Jan. 18, 2001

(65) Prior Publication Data

US 2002/0027692 A1 Mar. 7, 2002

(30) Foreign Application Priority Data

Jan. 20, 2000 (JP) ......................................... 2000-011420

(51) Int. Cl.[7] .............................. G02F 2/02; G02F 1/37; H03L 7/00
(52) U.S. Cl. ........................ 359/328; 359/326; 331/1 R; 331/18; 331/25
(58) Field of Search ................................ 359/115, 158, 359/162, 326, 328–332; 331/1 R, 18, 25

(56) References Cited

U.S. PATENT DOCUMENTS

| 5,706,113 A | 1/1998 | Kawanishi et al. | ......... 359/158 |
| 5,999,287 A | 12/1999 | Davies et al. | ............... 359/118 |
| 2002/0027692 A1 * | 3/2002 | Uchiyama et al. | .......... 359/158 |

FOREIGN PATENT DOCUMENTS

| EP | 0 619 658 A2 | 10/1994 |
| JP | 10-209962 | 8/1998 |

OTHER PUBLICATIONS

S. Kawanishi et al, "10 GHz Timing Extraction From Randomly Modulated Optical Pulses Using Phase–Locked Loop . . . Using Optical Gain Modulation", Electronics Letters, vol. 28, No. 5, Feb. 27, 1992, pp. 510–511.*
S. Kawanishi et al, "64 To 8 Gbit/s All–Optical Demultiplexing Experiment With Clock Recovery Using New Phase Lock Loop Technique", Electronics Letters, vol. 29, No. 2, Jan. 21, 1993, pp. 231–233.*
T. Saito et al, "Optical TDM 20 Gb/s–105 km Transmission Employing Newly Proposed Optical PLL Timing Extraction", IEEE Photonics Technology Letters, vol. 6, No. 4, Apr. 1994, pp. 555–557.*

* cited by examiner

Primary Examiner—John D. Lee
(74) Attorney, Agent, or Firm—Oblon, Spivak, McClelland, Maier & Neustadt, P.C.

(57) ABSTRACT

A phase-lock loop is formed by a voltage-controlled oscillator, a local optical pulse source, an optical branching device for branching the locally generated optical pulse stream from the local optical pulse source, a harmonic component local generation part for locally generating a harmonic component electrical signal from the one of two branched locally generated optical pulse streams, and a phase comparison part for comparing the phases of the locally generated harmonic component electrical signal and an incoming signal component electrical signal generated from an incoming optical signal pulse stream and for supplying the voltage-controlled oscillator with a control voltage corresponding to the phase difference between the two input electrical signals. The other branched output from the optical branching device is output as a locally generated optical pulse stream bit-phase synchronized with the incoming optical signal pulse stream.

24 Claims, 20 Drawing Sheets

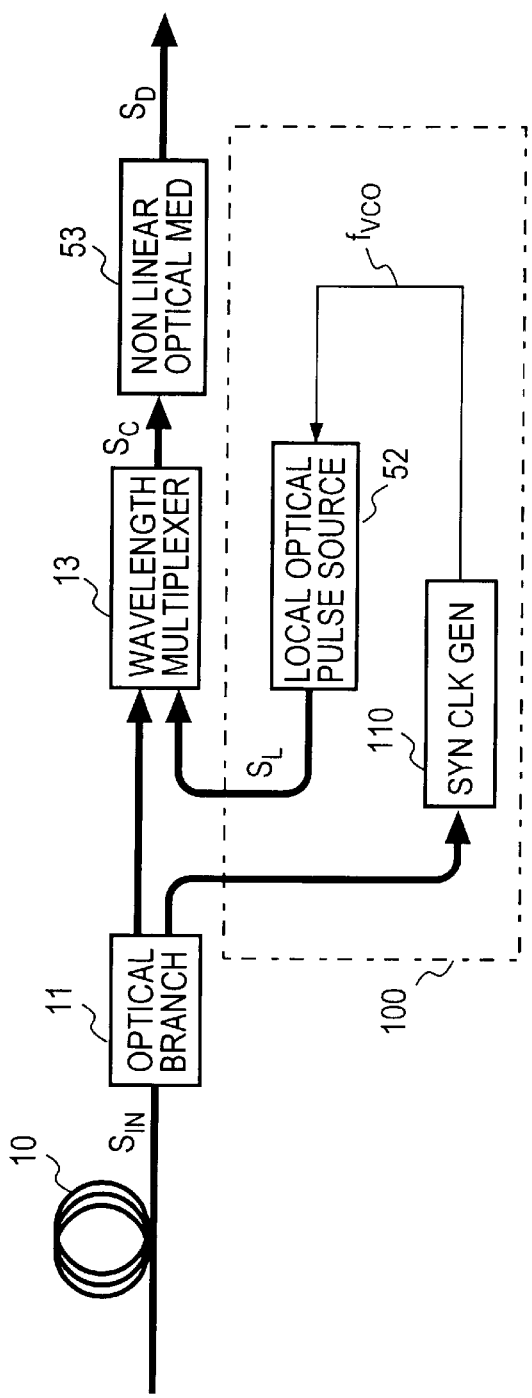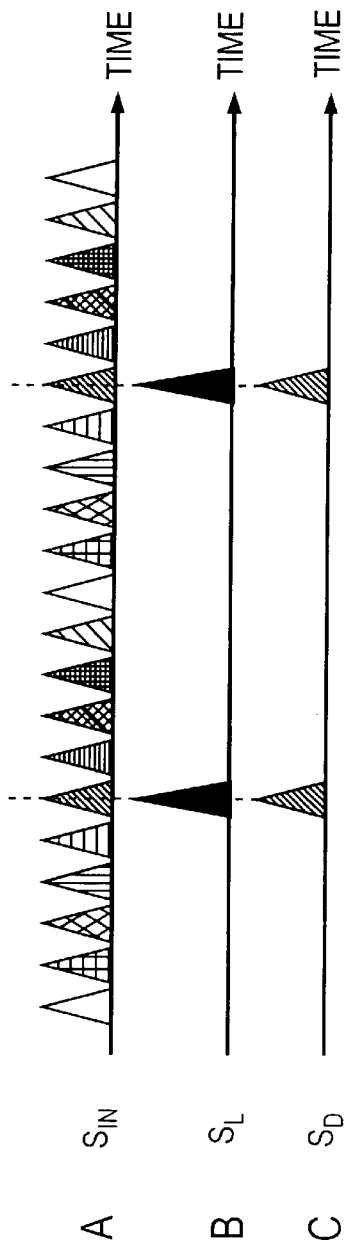
FIG. 2
FIG. 3

BIT-PHASE SYNCHRONIZED OPTICAL PULSE STREAM LOCAL GENERATOR

BACKGROUND OF THE INVENTION

The present invention relates to a bit-phase synchronized optical pulse stream local generator for locally generating an optical pulse stream synchronized in bit-phase with an ultrafast incoming optical signal pulse stream sent over a transmission line at a bit rate in excess of 100 Gbits/s.

With the recent fast-growing use of the Internet, data traffic is now on the increase, providing the impetus for further upgrading of large-capacity photonic networks. Time division multiplexing ranks with wavelength division multiplexing as a scheme effective in increasing the per-fiber channel capacity. The expansion of channel capacity through speedups of electronic circuit operations has now reached a level of 40 Gbits/s, where much difficulty is expected to encounter in further speedups. Optical signal processing based on a nonlinear optical effect that provides a sub-picosecond response speed is regarded as a technique capable of overcoming bandwidth limitations on electronic circuits and is now under research and development aiming at wide application to optical communication.

The optical signal processing that applies the nonlinear optical effect is to carry out switching, wavelength conversion and various other optical signal processing by timed interaction of input signal light with another ray of light (locally generated control light) in a nonlinear optical material. This technique is applicable to the generation of control light synchronized with the input signal light in all ultrafast all-optical control circuits that utilize the nonlinear optical effect, such as an all-optical time-division multiplexer, an all-optical time-division demultiplexer, an all-optical wavelength-division multiplexer and an all-optical add/drop circuit.

The optical signal processing necessitates the use of a bit-phase synchronized optical pulse stream local generator that locally generates an optical pulse stream synchronized with an optical pulse stream of a desired period in the incoming optical pulse streams. The timing accuracy necessary for the locally generated optical pulse stream becomes higher with an increase in the bit rate of the incoming optical pulse stream; for example, for bit rates of the 100-Gbit/s class, the required timing accuracy is better than one picosecond. In optical communications, since the signal light propagates usually over a long distance through an optical fiber transmission line, the timing of arrival of the signal light at the receiving end fluctuates with the expansion or shrinkage of the optical fibers used. To identify or distinguish respective bits of the received signal, it is necessary at the receiving end to extract from the received signal a clock corresponding to the timing fluctuation. The optical signal processing further requires the receiving end to prepare an optical pulse stream with the fluctuating timing.

An optical control pulse stream for processing the incoming signal pulse stream in synchronization therewith is usually generated by a mode-locked laser or similar short-pulse laser and subjected to amplification by an optical fiber amplifier and other processing, thereafter being coupled to the incoming optical signal pulse stream; in this case, the propagation delay through fairly long optical fiber components such as an optical fiber amplifier and a nonlinear pulse compression fiber readily varies (for instance, 50 ps/km/° C.) with an ambient temperature change. It is disclosed in K. L. Hall et al., IEEE Photon. Technol. Lett., vol. 7, pp. 935–937, 1995 to use a nonlinear optical loop mirror as an all-optical bit-phase sensor to synchronize the optical control pulse stream with the incoming optical signal stream having delay fluctuations by temperature variations of the optical fiber components. Because of the use of the nonlinear loop mirror in a phase detecting part, however, the proposed loop circuit has the defects of polarization dependence and incapability of compensating for fluctuations in the propagation delay of the optical fiber used as a nonlinear optical material for the nonlinear loop mirror.

FIG. 1 depicts an example of a conventional bit-phase synchronized optical signal pulse stream local generator identified generally by 100. In Japanese Patent Application Laid-Open Gazette No. 10-209926 there is described only a synchronized clock generation part 110 composed of an optical modulator 21, a photo detector 22, frequency multipliers 23 and 32, a phase comparator 41 and a voltage-controlled oscillator 51 in the bit-phase synchronized optical signal pulse stream local generator 100 of FIG. 1. A part of incoming optical signal pulse stream $S_{IN}$ of a bit rate $Nf_a$ (where N is the number of multiplexed channels), which is a time-division multiplexed optical pulse stream, is provided via an optical branching device 11 to the optical modulator 21, wherein it is modulated by a signal of a frequency $kf_{VCO}$ generated by a k-fold frequency multiplication of the output from the voltage-controlled oscillator 51 by the frequency multiplier 23. As a result, the photo detector 22 yields an electrical signal of a downconverted frequency $Nf_a-nkf_{VCO}$. This electrical signal is applied to the phase comparator 41. The bit rate of the incoming optical signal pulse stream is as high as 100 Gbits/s, for instance, and hence it is difficult to process the optical signal pulse stream of such a high bit rate by an electronic circuit. The technique of downconverting the frequency by the optical modulator 21 as mentioned above is disclosed in, for example, Japanese Patent Application Laid-Open Gazette No. 10-65225. On the other hand, a local oscillation signal $S_{VCO}$ of a frequency $f_{VCO}$ generated by the voltage-controlled oscillator 51 is multiplied h-fold by the frequency multiplier 32 (assumed to be set at a multiplication number of h), and the resulting locally generated, multiplied signal of a frequency $hf_{VCO}$ is applied to the phase comparator 41 for phase comparison with the output from the photo detector 22. The voltage-controlled oscillator 51 is controlled so that the phases of the two input signals to the phase comparator 41 are locked relative to each other. The constants N, n, k and h are integers equal to or greater than 1. These constants are predetermined such that the frequencies of the two input signals to the phase comparator 41 are $Nf_a-nkf_{VCO}=hf_{VCO}$, that is, such that the oscillation frequency of the voltage-controlled oscillator 51 is $f_{VCO}=Nf_a/(nk+h)$ and that the value of $N/(nk+h)$ becomes a natural number (an integer equal to or greater than 1). Accordingly, a phase error or difference signal obtained by the phase comparison is fed back as a control voltage $V_C$ to the voltage-controlled oscillator 51 to control its local oscillation frequency $f_{VCO}$. In consequence, the voltage-controlled oscillator 51 is controlled so that the phases of the two input signals to the phase comparator 41 are locked relative to each other. That is, the frequency multiplier 32, the phase comparator 41 and the voltage-controlled oscillator 51 constitute a phase-locked loop PLL. The local oscillation signal $S_{VCO}$ output from the voltage-controlled oscillator 51 is phase-synchronized with the incoming optical signal pulse stream $S_{IN}$, and drives a local optical pulse source 52. Accordingly, the local optical pulse source 52 outputs a locally generated optical pulse stream $S_L$ of a frequency $f_{VCO}=Nf_a/(nk+h)$ that is synchronized in bit phase with the incoming optical signal pulse stream $S_{IN}$.

In the conventional bit-phase synchronized optical pulse stream local generator 100 depicted in FIG. 1, a delay fluctuation occurs in the local optical pulse source 52, causing a phase fluctuation in the output pulse stream.

The local oscillation signal $S_{VCO}$ output from the voltage-controlled oscillator 51 ought to be synchronized in phase with the incoming optical signal pulse stream $S_{IN}$ under the control of the phase-locked loop by the phase comparator 41, but owing to the phase fluctuations occurring in the local optical pulse source 52 outside the phase-locked loop, the bit phase of the locally generated optical pulse stream $S_L$ is not synchronized with the incoming optical signal pulse stream $S_{IN}$.

FIG. 2 is a block diagram depicting an example of the basic configuration of a typical optical time-division demultiplexer applying the nonlinear optical effect. A nonlinear optical medium 53 is connected to the output of an optical wavelength multiplexer 13 in FIG. 1, and an optical pulse stream $S_D$ synchronized with the locally generated optical pulse stream $S_L$ is extracted from the incoming time-division-multiplexed optical signal pulse stream $S_{IN}$ and is output. In this case, the conventional local optical pulse source 52 and the synchronized clock signal generator 110 constitute an optical control pulse stream generator, that is, the optical bit-phase synchronized pulse stream local generator 100. The synchronized clock signal generator 110 has the same configuration as shown in FIG. 1. Accordingly, it is impossible to compensate for the delay fluctuations occurring in the local optical pulse source (optical control pulse source) 52.

In the conventional optical time-division demultiplexer depicted in FIG. 2, the locally generated optical control pulse stream $S_L$ (FIG. 3B) is generated which has a repetition frequency $Nf_a/N$ (that is, $f_a$) and is synchronized in bit phase with the incoming optical signal pulse stream $S_{IN}$ (FIG. 3A) of a repetition frequency $Nf_a$ (where N is a natural number), and the both pulse streams $S_{IN}$ and $S_L$ are multiplexed by the optical wavelength multiplexer 13 into a multiplexed optical signal $S_C$, which is provided to the nonlinear optical medium 53.

The nonlinear optical medium 53 causes a nonlinear optical effect, such as cross-phase modulation or four wave mixing, between the signal light $S_{IN}$ and the control light $S_L$. As the result of this, those pulses of the incoming optical signal pulse stream $S_{IN}$ which temporally coincide with the optical control pulse stream $S_L$ shown in FIG. 3B are demultiplexed directly or through an adequate optically passive component and output as the optical demultiplexed signal pulse stream $S_D$ as depicted in FIG. 3C.

As will readily be understood from the above, a timing error between the incoming optical signal pulse stream $S_{IN}$ and the optical control pulse stream $S_L$ will cause a failure in correct demultiplexing of an intended channel, giving rise to a serious problem that the basic function of the time-division demultiplexer cannot be fulfilled properly.

FIGS. 4A and 4B are diagram for explaining the influence of the timing error between the incoming signal pulse stream $S_{IN}$ and the optical control pulse stream $S_L$. In an optical switch that utilizes the nonlinear optical effect by the optical control pulse stream $S_L$, the temporal or evolution of a switching window (transmittance) is about the same as the temporal evolution of the optical control pulse intensity. That is, the transmittance (i.e., the signal-to-noise ratio) changes, depending on whether the incoming optical signal pulse $S_{IN}$ is multiplexed with the optical control pulse $S_L$ substantially at the center or lower end thereof. Accordingly, a fluctuation in the timing between the control light $S_L$ and the incoming signal light $S_{IN}$ causes a fluctuation in the intensity (or signal-to-noise ratio) of the demultiplexed light $S_D$, constituting a fatal obstacle to satisfactory signal transmission. And, as the fluctuation grows, the desired optical signal pulse stream can no longer be demultiplexed and an optical signal pulse stream of an adjacent time slot is demultiplexed instead, thus bringing about a worse situation.

In some cases, the local optical pulse source (control light source) 52 is formed by, for example, an optical fiber amplifier for supercontinuum generation (Electron. Lett., vol. 34, pp. 575–576, 1998). The optical fiber amplifier for supercontinuum generation usually has a length on the order of kilometers, and its thermal expansion coefficient is around 50 ps/km/° C.; therefore, assuming that the optical fiber amplifier is 1 km long, a temperature change of 1° C. will cause a delay fluctuation of 50 ps. This 50-ps delay fluctuation is a time interval corresponding to, for instance, five slots in an optical signal of a 100 Gbits/s bit rate. This means that the timing error between the optical signal pulse stream $S_{IN}$ and the optical control pulse stream $S_L$ corresponds to five time slots.

SUMMARY OF THE INVENTION

It is therefore an object of the present invention to provide a bit-phase synchronized optical pulse stream local generator that is capable of generating an optical pulse stream synchronized in bit phase with incoming signal light even if a delay fluctuation occurs in the local optical pulse source.

According to the present invention, there is provided a bit-phase synchronized optical pulse stream local generator for generating an optical pulse stream synchronized in bit phase with an incoming optical signal pulse stream, the local generator comprising:

a voltage-controlled oscillator for generating a local oscillation signal in a phase controlled by a control voltage;

a local optical pulse source driven by the local oscillation signal to generate an optical pulse stream;

an optical branching device for branching the locally generated optical pulse stream into first and second locally generated optical pulse streams and for outputting the first locally generated optical pulse stream as an optical control pulse stream synchronized in bit phase with the incoming optical signal pulse stream;

a harmonic component local generation part supplied with the second locally generated optical pulse stream, for generating a harmonic component electrical signal that contains a harmonic component of the frequency of the second locally generated optical pulse stream;

an incoming signal component generating part supplied with the incoming optical signal pulse stream, for generating an incoming signal component electrical signal that contains its bit phase information; and a phase comparison part supplied with the locally-generated harmonic component electrical signal and the incoming signal electrical signal, for comparing their phases and for generating the phase error or difference between them for application as the control voltage to the voltage-controlled oscillator.

A path containing the phase comparison part, the voltage-controlled oscillator, the local optical pulse source, the optical branching device and the harmonic component local generation part constitutes a phase-locked loop for the incoming signal component electrical signal.

BRIEF DESCRIPTION OF THE DRAWINGS

FIG. 2 is a block diagram showing a typical optical time-division demultiplexer applying a nonlinear optical effect;

FIG. 3 is a diagram for explaining an optical time-division demultiplexing scheme;

DETAILED DESCRIPTION OF THE PREFERRED EMBODIMENTS

First Embodiment

Figure 1:
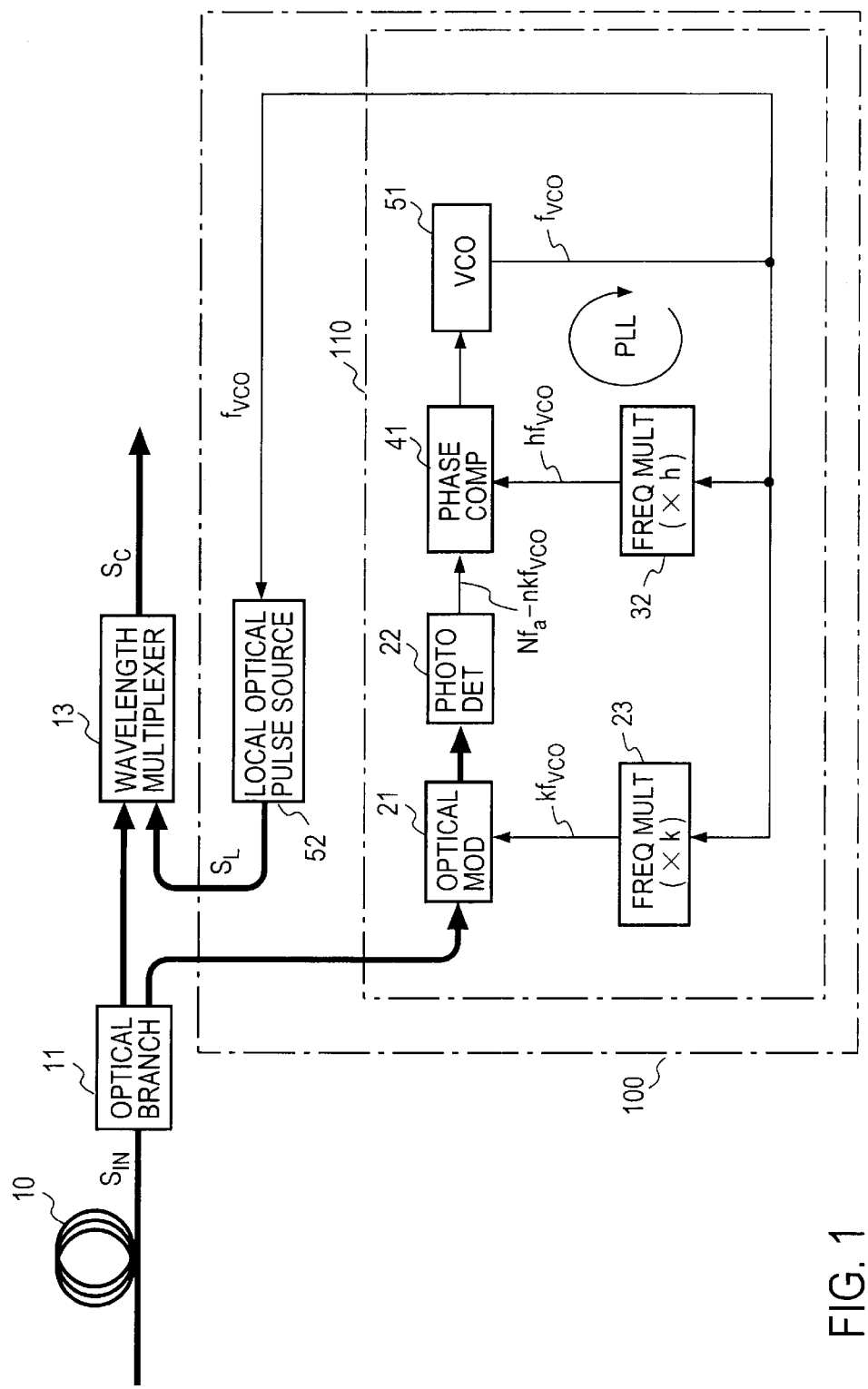
FIG. 1 is a block diagram depicting an example of a conventional bit-phase synchronized optical pulse stream local generator.
Figure 4A:
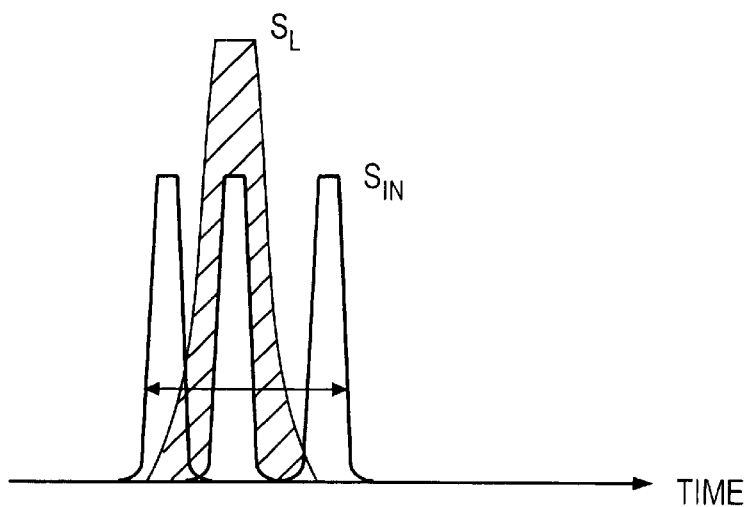
FIG. 4A is a diagram showing the timing relationship between an incoming optical signal pulse stream $S_{IN}$ and an optical control pulse stream $S_L$.
Figure 4B:
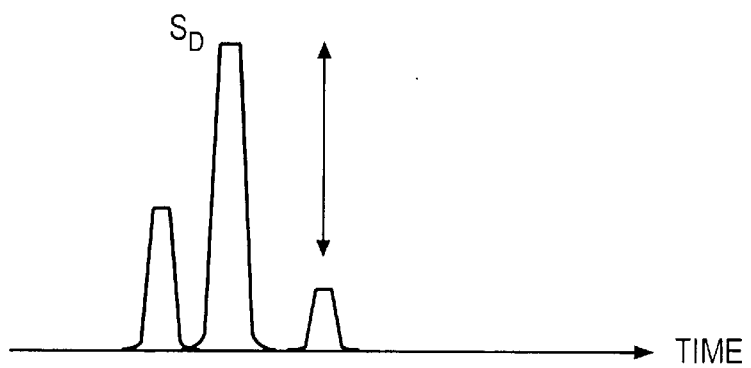
FIG. 4B is a diagram showing the influence of a timing error on a demultiplexed signal in FIG. 4A.
Figure 5:
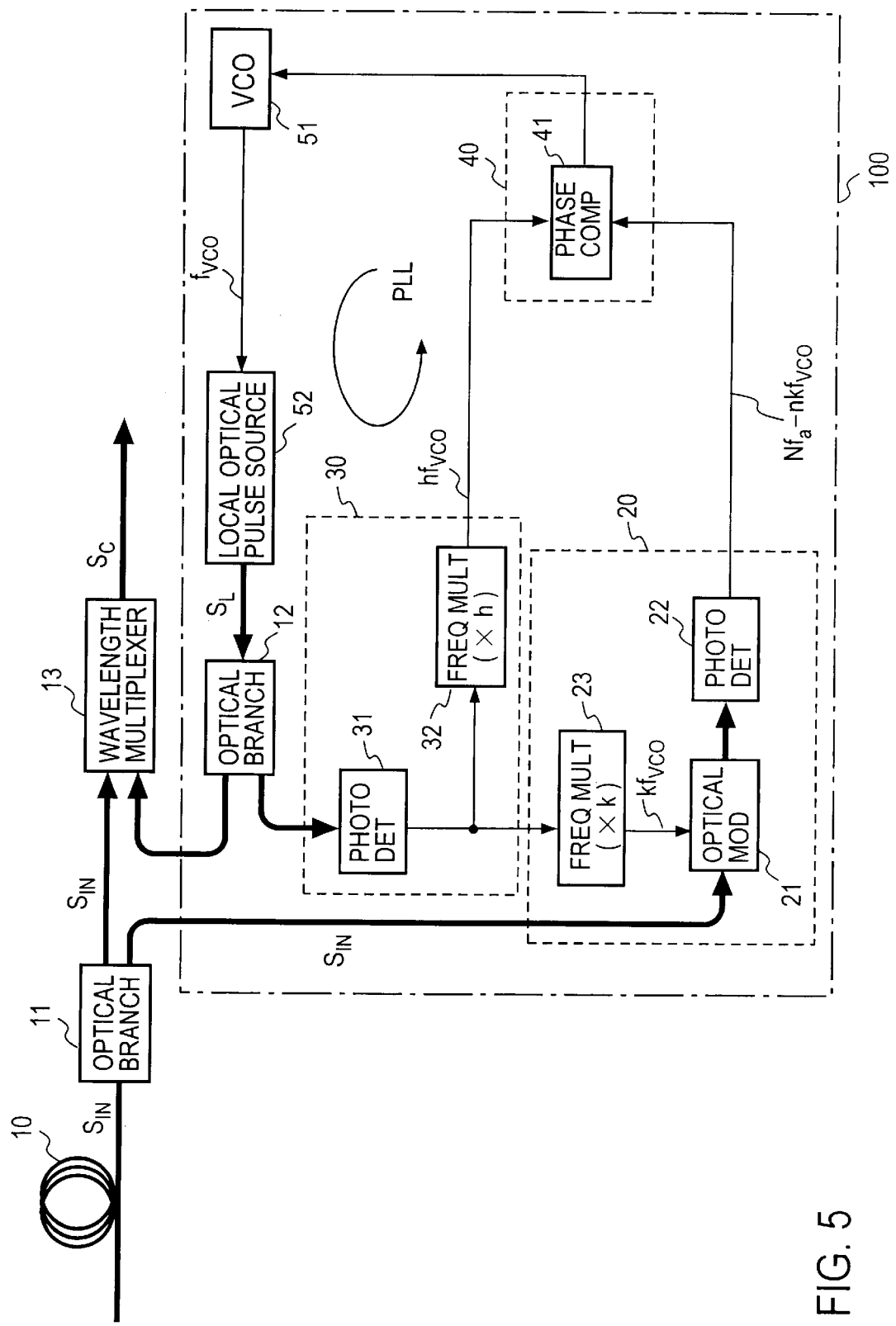
FIG. 5 is a block diagram illustrating a bit-phase synchronized optical pulse stream local generator according to a first embodiment of the present invention.

FIG. 5 illustrates in block form a bit-phase synchronized optical pulse stream local generator 100 according to a first embodiment of the present invention for locally generating an optical pulse stream $S_L$ synchronized in bit phase with an incoming optical signal pulse stream $S_{IN}$ of a bit rate $Nf_a$ (where N is an integer equal to or greater than 1). In the bit-phase synchronized optical pulse stream local generator 100 according to the present invention, an optical branching device 12 is connected to the output side of the local optical pulse source 12 in the FIG. 1 configuration, by which the locally generated optical pulse stream $S_L$ is branched into two. The one of the two branched optical pulse streams is provided to the optical wavelength multiplexer 13 wherein it is multiplexed with the incoming optical signal pulse stream $S_{IN}$. The other optical pulse stream $S_L$ is provided to a harmonic component local generation part 30 for generating a harmonic component electrical signal containing a multiple frequency component of the frequency $f_{VCO}$ of the optical pulse stream $S_L$. A phase comparison part 40 compares the phases of the locally generated harmonic component electrical signal from the harmonic component local generation part 30 and an incoming signal component electrical signal from an incoming signal component generation part 20, and provides the control voltage $V_C$ to the voltage-controlled oscillator 51 so that the phases of the both electrical signals are locked relative to each other.

The optical branching device 11 branches the incoming optical signal $S_{IN}$ of the frequency $Nf_a$, generated by N-channel time-division multiplexing of an optical pulse stream of a $1/f_a$ period, into two branched incoming optical signals, the one of which is applied to the incoming signal component generation part 20. Supplied with an optical pulse stream that is the incoming optical signal, the incoming signal generation part 20 generates a sine-wave electrical signal that has its bit repetition frequency downconverted while retaining bit phase information of the incoming optical signal. The voltage-controlled oscillator 51 generates an oscillation signal of the frequency $f_{VCO}$ phase-controlled by the control voltage $V_C$ fed thereto. The local oscillation signal from the voltage-controlled oscillator 51 is applied as a drive signal to the local optical pulse source 52, by which an optical pulse stream $S_L$ of a $1/f_{VCO}$ period is generated. The construction of the local optical pulse source 52 is similar to that employed in FIG. 1 and comprises such optical fiber components as described in the previously recited K. L. Hall et al literature, and therefore, inherently produces pulse delay fluctuation.

The locally generated optical pulse stream $S_L$ is provided to the optical branching device 12, by which it is branched into two pulse streams, the one of which is multiplexed by the optical wavelength multiplxer 13 with the other branched incoming optical pulse stream from the optical branching device 11. The other branched locally generated optical pulse stream $S_L$ is fed to the harmonic component local generation part 30, by which is generated a harmonic component electrical signal containing a harmonic component of the frequency of the input pulse stream $S_L$. The phase comparison part 40 is formed by the phase comparator 41 in this embodiment, which compares the phases of the incoming signal component electrical signal from the incoming signal component generation part 20 and the locally generated harmonic component electrical signal from the harmonic component local generation part 30 and provides the voltage corresponding to the phase difference, as the control voltage $V_C$, to the voltage-controlled oscillator 51.

The phase comparison part 40, the voltage-controlled oscillator 51, the local optical pulse source 52, the optical branching device 12 and the harmonic component local generation part 30 constitute a phase-locked loop PLL for the incoming signal component electrical signal. What is the most important thing in the present invention is to incorporate the local optical pulse source 52 in the phase-locked loop PLL so that the latter operates to suppress delay fluctuations of optical pulses in the former.

In this embodiment the harmonic component local generation part 30 comprises: a photo detector 31 that is supplied with the branched optical pulse stream from the optical branching device 12 and converts it to an electric pulse stream of the frequency $f_{VCO}$; and a frequency multiplier 32 that multiplies h-fold the frequency $f_{VCO}$ of the electric pulse stream to locally generate an electric harmonic component signal of a frequency $hf_{VCO}$ for application to the phase comparison part 40. The incoming signal component generation part 20 is made up of an optical modulator 21, a photo detector 22 and a frequency multiplier 23. The frequency multiplier 23 multiplies the electrical signal of the frequency $f_{VCO}$ from the photo detector 31 to a k-fold frequency, and the optical modulator 21 modulates the branched incoming optical signal $S_{IN}$ from the optical branching device 11 by the electrical signal of the frequency $kf_{VCO}$ to generate a downconverted incoming signal component signal of a frequency $Nf_a - nkf_{VCO}$, which is converted by the photo detector 22 to an electrical signal for application to the phase comparison part 40.

The constants N, h, n and k are integers equal to or greater than 1, which are preset such that the frequencies $hf_{VCO}$ and $Nf_a - nkf_{VCO}$ of the two input signals to the phase comparator 41 are equal to each other, that is, such that the oscillation frequency of the voltage-controlled oscillator 51 is $f_{VCO} = Nf_a/(h+kn)$ and that the value $N/(h+kn)$ is a natural number. The phase comparison part 40 compares the phases of the locally generated harmonic component electrical signal of the frequency $hf_{VCO}$ and the incoming signal component electrical signal of the frequency $Nf_a - nkf_{VCO}$, and provides the voltage corresponding to the phase difference between them, as the control voltage $V_C$, to the voltage-controlled oscillator 51, by which the phase-locked loop PLL is controlled so that the phases of the two signals are locked relative to each other.

The incoming optical signal pulse stream $S_{IN}$ of the frequency $Nf_a$ is converted by the photo detector 22 to an electrical signal after being modulated by the optical modulation 21 for the reasons given below. The bit rate $Nf_a$ of the incoming optical signal pulse stream $S_{IN}$ is as high as 100 Gbits/s or so, and the phase comparator 41 capable of processing such a high bit-rate signal is difficult to form by an electronic circuit. By downconverting the incoming optical signal pulse stream $S_{IN}$ to the lower frequency $Nf_a - nkf_{VCO}$ through modulation, the formation of the phase comparator 41 becomes easy. The optical modulator 21 used is of the type that responds nonlinearly to an electric drive signal, such as an optical intensity modulator, electroabsorption optical modulator, optical comb generator, or optical phase modulator. Incidentally, the optical modulator 21 may also be one that has a linear response characteristic. The same goes for the embodiment described below.

Figures 6A, 6B:
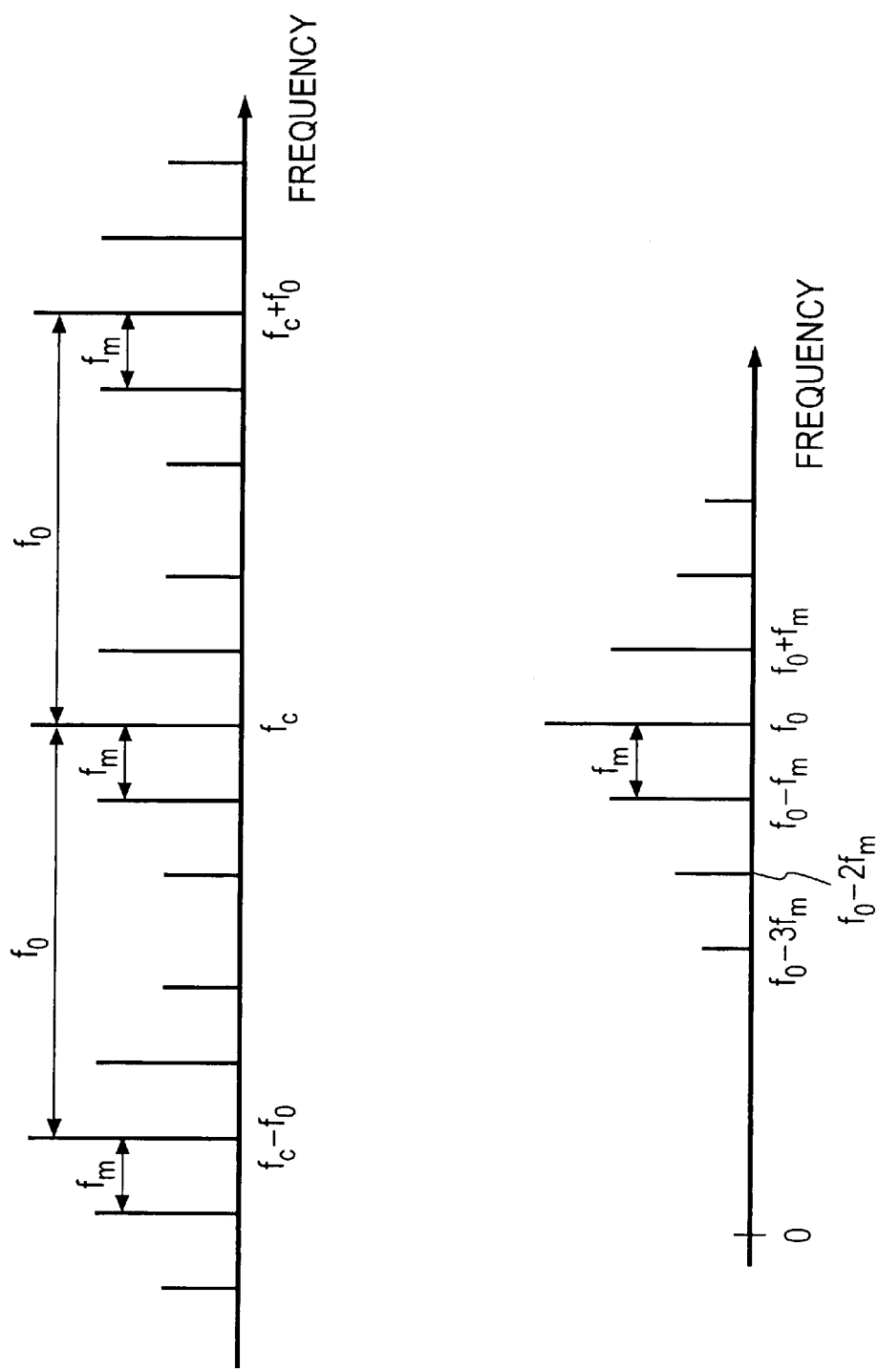
FIG. 6A is a diagram showing the frequency spectrum of the optical output from an optical modulator 21 in FIG. 5.
FIG. 6B is a diagram showing the frequency spectrum of the electric output from a photo detector 22 in FIG. 5.

Now, a description will be given of the downconersion by the optical modulator 21. FIG. 6A shows the optical frequency spectrum of the optical output provided from the optical modulator 21 wherein an optical pulse stream of a repetition frequency $f_o$ is modulated with an electrical signal of a frequency $f_m$.

The optical pulse stream of the repetition frequency $f_o$ has modulation components $f_c + f_o$ and $f_c - f_o$ on both sides of the carrier frequency $f_c$ of light. In the optical modulator 21 these components are modulated by the electrical signal of the frequency $f_m$, and as depicted in FIG. 6A, many modulation sidebands by the frequency $f_m$ are newly generated for the carrier component $f_c$ and the modulation component $f_c + f_o$, $f_c - f_o$ respectively.

FIG. 6B shows the power spectrum of an electrical signal to which these sidebands are converted by the photo detector 22. In the power spectrum beat signals ($f_o \pm nf_m$, where n is a natural number) appear about the frequency $f_o$ at intervals of $f_m$. With an actual photodiode of a limited frequency bandwidth, too, it is possible to detect beat signals in the low-frequency region.

The modulated sidebands hold phase information of the original signal, and the beat signal between the modulated sidebands also reflects the phase information. Accordingly, by using this beat signal to form the same phase-locked loop as that in the past, the optical pulses of a bit-rate above 100 Gbits/s, provided from the local optical pulse source 52, could be synchronized with the electrical signal output from the photo detector 22.

Incidentally, the multiplication numbers k and h may take various values (natural numbers), depending on the order of that one of the beat signals produced in the optical modulator 21 which is to be detected. For example, when the multiplication number k of the frequency multiplier 23 is k=1, that is, when the frequency multiplication number is 1, the frequency multiplier 23 does not ever act on the input electrical signal; hence, the frequency multiplier 23 can be omitted. That is, a frequency multiplier of the multiplication number 1 is common in operation to a mere high-frequency transmission line that has a predetermined transmission band. The same is true of the frequency multiplier 32. In the following embodiment, too, the multipliers 23 and 32 can be omitted when their frequency multiplication number is 1.

The predetermined transmission band mentioned herein means that it covers the frequency band of the electrical signal passing therethrough. For example, if its multiplication number k is 1, the frequency multiplier 23 can be replaced with a high-frequency transmission line that has the frequency $kf_{VCO}$ in its transmission band. Accordingly, in this specification a high-frequency transmission line identical in operation with the frequency multiplier of the multiplication number 1 is also regarded as a frequency multiplier. That is, the frequency multiplier mentioned herein is defined to include frequency multipliers whose multiplication numbers are more than 1 and high-frequency transmission lines common in operation to the multiplier whose multiplication number is 1. This definition applies as well to frequency multipliers other than those 23 and 32.

In other words, the bit-phase synchronized optical pulse stream local generator depicted in FIG. 5 is a circuit that functions as a phase-locked loop in which: a portion of the output light from the local optical pulse source 52 is branched into two after being converted by the photo detector 31 to an electrical signal; the one branched output is multiplied k-fold; the other branched output is multiplied h-fold; an ultrafast optical pulse stream (of the frequency $Nf_a$) of a bit rate above 100 Gbits/s is input to the optical modulator 21 that is driven by the k-multiplied electrical signal (of the frequency $kf_{VCO}$); the optical output signal from the optical modulator 21 is converted to an electrical signal of the frequency $Nfa-nkf_{VCO}$; the phases of the converted electrical signal of the frequency $Nf_a-nkf_{VCO}$ and the h-multiplied electrical signal (of the frequency $hf_{VCO}$) are compared by the phase comparator 41; and the phase error signal thus obtained is fed back to the voltage-controlled oscillator 51. With such a circuit arrangement, it is possible to generate, as the output from the local optical pulse source 52, the locally generated optical pulse stream $S_L$ synchronized in phase with the ultrafast incoming optical signal pulse stream $S_{IN}$.

Second Embodiment

Figure 7:
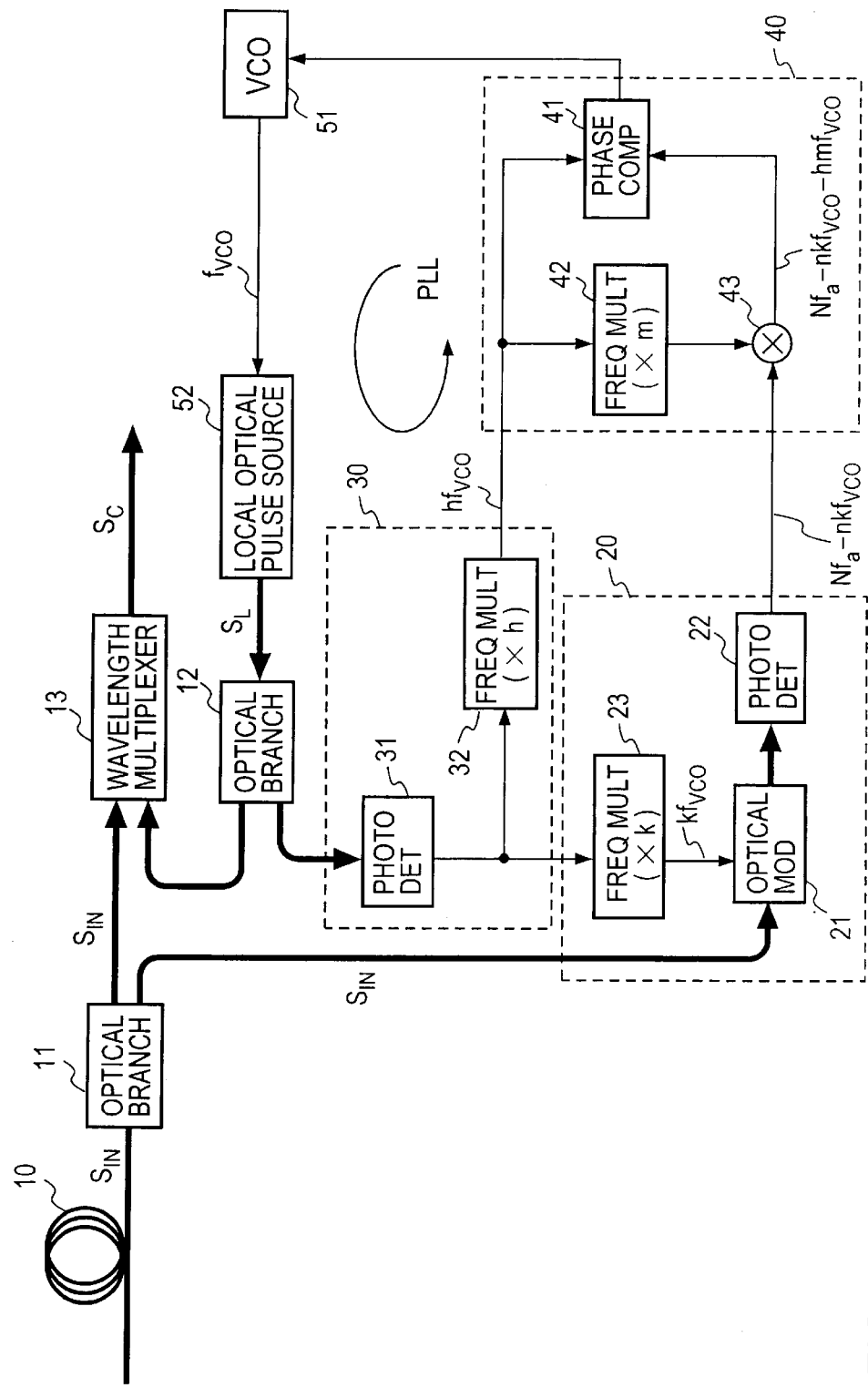
FIG. 7 is a block diagram illustrating a bit-phase synchronized optical pulse stream local generator according to a second embodiment of the present invention.

FIG. 7 illustrates in block form a bit-phase synchronized optical pulse stream local generator according to a second embodiment of the present invention. This embodiment is identical in basic construction with the FIG. 5 embodiment except that the phase comparison part 40 is made up of a frequency multiplier 42, a mixer 43 and the phase comparator 41. In this embodiment the electrical signal of the frequency $hf_{VCO}$ fed from the frequency multiplier 32 in the local harmonic component generation part 30 is multiplied m-fold by the frequency multiplier 42, thereafter being provided to the mixer 43. The mixer 43 mixes the electrical signal of the frequency $Nf_a-nkf_{VCO}$ from the photo detector 22 of the incoming signal component generation part 20 and the m-multiplied electrical signal from the frequency multiplier 42, and output the mixed signal of a difference frequency $Nf_a-nkf_{VCO}-hmf_{VCO}$. The phase comparator 41 compares the phases of the locally generated electric harmonic component signal of the frequency $hf_{VCO}$ and the signal of the frequency $Nf_a-nkf_{VCO}-hmf_{VCO}$ from the mixer 43, and provides the voltage corresponding to the phase difference, as the control voltage $V_C$, to the voltage-controlled oscillator 51.

The constants N, n, k, m and h are predetermined such that the frequencies $hf_{VCO}$ and $Nf_a-nkf_{VCO}-hmf_{VCO}$ of the two input signals to the phase comparator 41 are equal to each other, and consequently, such that $f_{VCO}=Nf_a/(nk+hm+h)$, and that the value of $N/(nk+hm+h)$ is a natural number. In this embodiment, since the frequency $Nf_a-f_{VCO}(nk+hm)$ of the incoming-signal-component electrical signal to be applied to the phase comparator 41 can be made lower than the frequency $Nf_a-nkf_{VCO}$ of the incoming-signal-component electrical signal fed to the phase comparator 41 in the FIG. 5 embodiment, the phase comparator 41 can be formed at lower cost accordingly.

Third Embodiment

Figure 8:
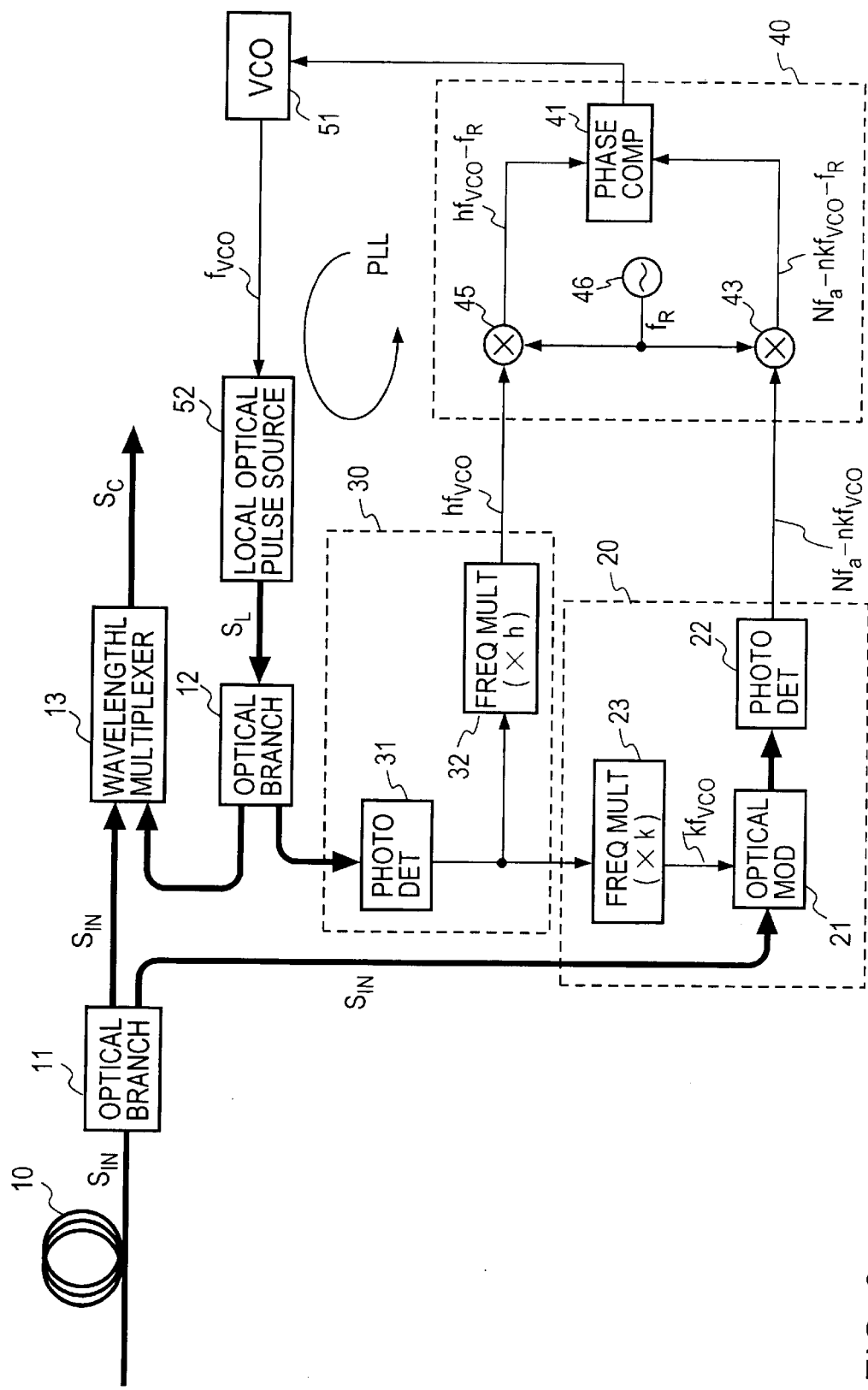
FIG. 8 is a block diagram illustrating a bit-phase synchronized optical pulse stream local generator according to a third embodiment of the present invention.

FIG. 8 illustrates in block form a third embodiment of the present invention. In the phase comparison part 40 in this embodiment, the locally generated harmonic component electrical signal of the frequency $hf_{VCO}$ is frequency-mixed by a mixer 45 with a reference signal of a frequency $f_R$ from a reference signal source 46 to generate a signal of a lower difference frequency $hf_{VCO}-f_R$, which is applied to the phase comparator 41. On the other hand, the incoming-signal-component electrical signal of the frequency $Nf_a-nkf_{VCO}$ from the incoming component generation part 20 is frequency-mixed by the mixer 43 with the reference signal of the frequency $f_R$ to generate a signal of a lower difference frequency $Nf_a-nkf_{VCO}-f_R$, which is also applied to the phase comparator 41. The values of the constants N, n, h and k are preset such that the frequencies $hf_{VCO}-f_R$ and $Nf_a-nkf_{VCO}-f_R$ of the two input signals to the phase comparators 41 are equal to each other, and consequently, such that $f_{VCO}=Nf_a/(h+nk)$ and that the value of $N/(h+nk)$ is a natural number.

In this embodiment, since the frequencies of the input signals to the phase comparator 41 are both lower than in the FIG. 5 embodiment by $f_R$, the phase comparator 41 can be formed with more ease accordingly.

Forth Embodiment

Figure 9:
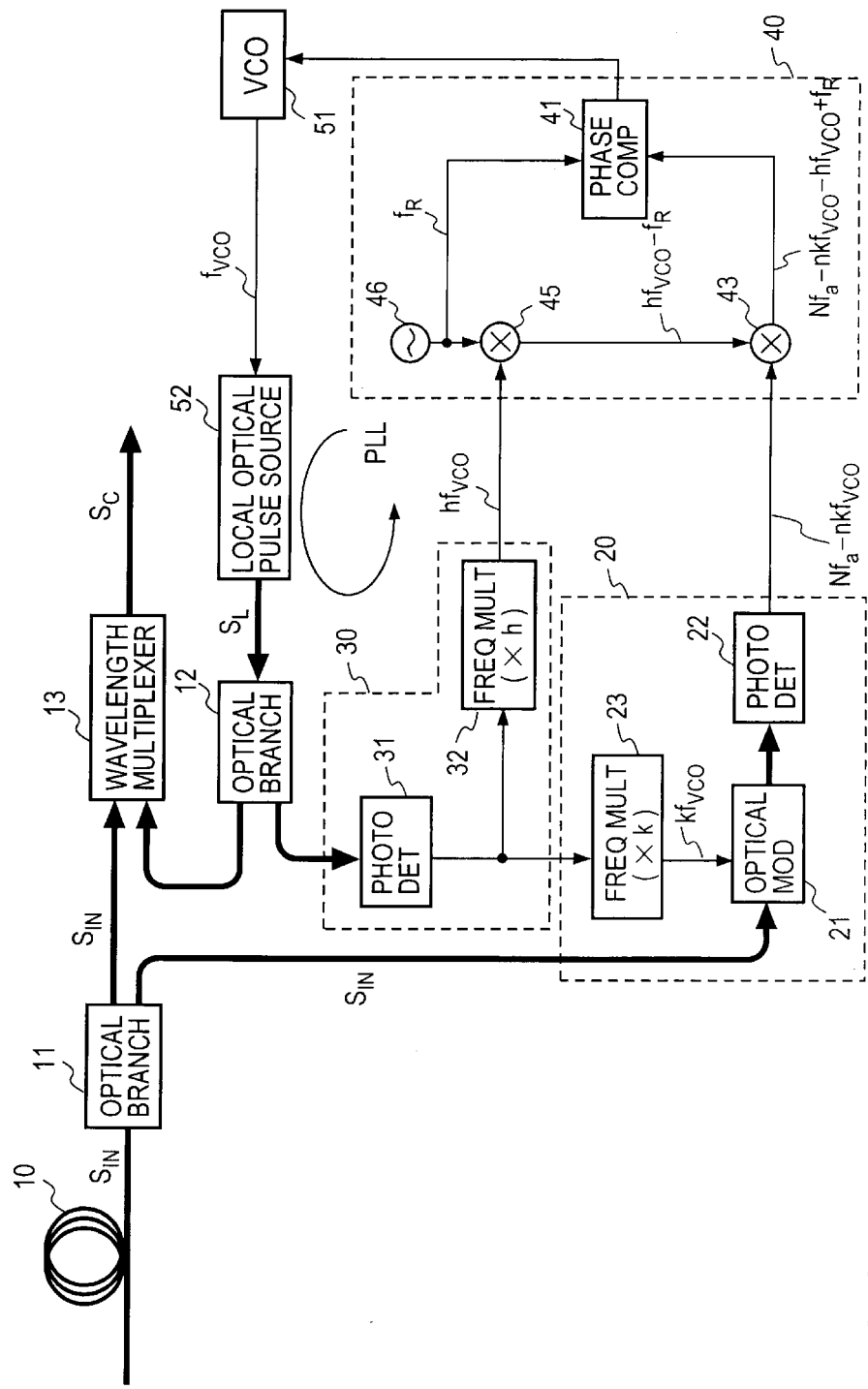
FIG. 9 is a block diagram illustrating a bit-phase synchronized optical pulse stream local generator according to a fourth embodiment of the present invention.

FIG. 9 illustrates in block form a fourth embodiment of the present invention, in which the phase comparison part 40 comprises the phase comparator 41, the mixers 43 and 45 and the reference signal source 46. The mixer 45 frequency-mixes the locally generated harmonic component electrical signal of the frequency $hf_{VCO}$ and the reference signal of the frequency $f_R$ from the reference signal source 46 to generate the signal of the lower difference frequency $hf_{VCO}-f_R$. This signal is not directly applied to the phase comparator 41 but instead to the mixer 43, wherein it is frequency-mixed with the incoming-signal-component electrical signal of the frequency $Nf_a-nkf_{VCO}$ to generate a signal of the difference frequency $Nf_a-nkf_{VCO}-hf_{VCO}+f_R$. The phase comparator 41 compares the phases of the reference signal of the frequency $f_R$ and the signal of $Nf_a-nkf_{VCO}-hf_{VCO}+f_R$, and applies a voltage corresponding to the phase difference, as the control voltage $V_C$, to the voltage-controlled oscillator 51. The values of the constants N, n, k and h are preset such that the frequencies $f_R$ and $Nf_a-nkf_{VCO}-hf_{VCO}+f_R$ of the two input signals to the phase comparators 41 are equal to each other, and consequently, such that $f_{VCO}=Nf_a/(h+nk)$ and that the value of $N/(nk+h)$ is a natural number. Accordingly, the operation of the phase comparator 41 is equivalent to an operation for the relative phase-lock-in between the phases of the incoming-component ($Nf_a$) signal and the locally generated harmonic component ($nkf_{VCO}-hf_{VCO}$) signal. In this embodiment, too, the oscillation frequency of the voltage-controlled oscillator 51 during the equilibrium state of the phase-locked loop PLL is $f_{VCO}=Nf_a/(nk+h)$ as is the case with the FIG. 5 embodiment.

Fifth Embodiment

Figure 10:
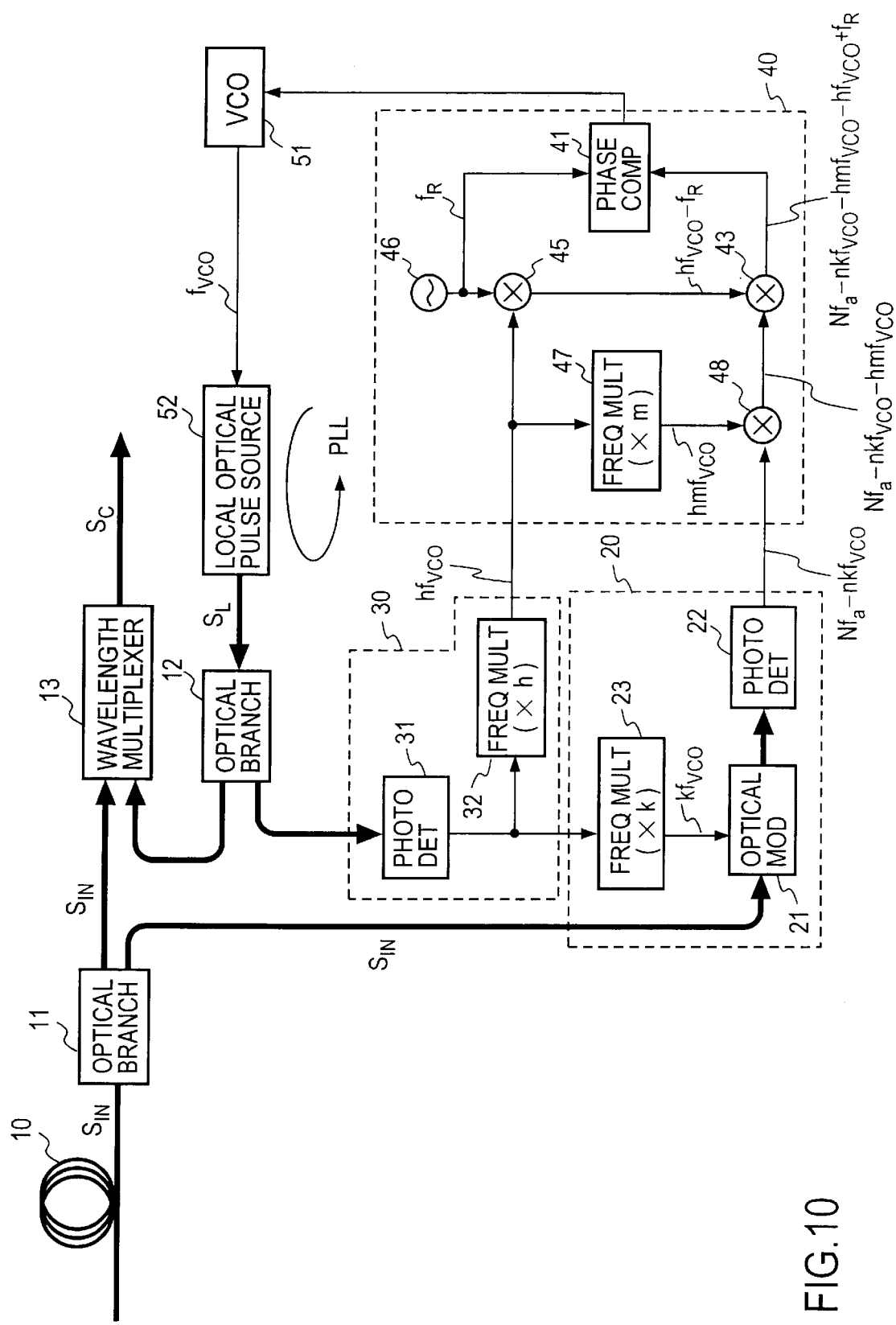
FIG. 10 is a block diagram illustrating a bit-phase synchronized optical pulse stream local generator according to a fifth embodiment of the present invention.

FIG. 10 illustrates in block form a modification of the FIG. 9 embodiment. In this embodiment a mixer 48 is inserted between the output of the photo detector 22 and the input of the mixer 43, and a frequency multiplier 47 is provided to multiply m-fold the output from the frequency multiplier 32, the m-multiplied output being applied to the mixer 48.

In this embodiment the locally generated electric harmonic component signal from the harmonic component local generation part 30 of the frequency $hf_{VCO}$ is applied to the frequency multiplier 47 as well as the mixer 45. The frequency multiplier 47 multiplies m-fold the frequency $hf_{VCO}$ of the locally generated harmonic component electrical signal and provides the m-multiplied output to the mixer 48. The mixer 48 mixes the incoming signal component electrical signal of the frequency $Nf_a-nkf_{VCO}$ from the incoming signal component generation part 20 and the signal of the frequency $hmf_{VCO}$ from the frequency multiplier 47 to generate a signal of the difference frequency $Nf_a-nkf_{VCO}-hmf_{VCO}$, which is applied to the mixer 43. The mixer 43 mixes the signal of the frequency $hf_{VCO}-f_R$ from the mixer 45 and the output from the mixer 48 to generate a signal of the difference frequency $Nf_a-nkf_{VCO}-hmf_{VCO}+f_R-hf_{VCO}$, which is applied to the phase comparator 41.

The values of the constants N, n, k, h and m are preset such that the frequencies $f_R$ and $Nf_a-nkf_{VCO}-hmf_{VCO}-hf_{VCO}+f_R$ of the two input signals to the phase comparators 41 are equal to each other, and consequently, such that $f_{VCO}=Nf_a/(nk+hm+n)$ and that the value of $N/(nk+hm+h)$ is a natural number. Accordingly, the control of the voltage-controlled oscillator 51 based on the phase difference detected by the phase comparator 41 is equivalent to the control by the phase comparator 41 in the FIG. 7 embodiment. In this embodiment the frequencies of the input signals to the phase comparator 41 are lower than in the FIG. 9 embodiment by $hm_{VCO}$.

Sixth Embodiment

Incidentally, in the case where the demultiplexed optical pulse stream $S_D$ extracted by the nonlinear optical medium 53 in FIG. 2 is converted to an electrical signal and its logical level is discriminated, an electric clock signal is needed which is synchronized with the demultiplexed signal. The demultiplexed optical pulse stream extracted by the nonlinear optical medium 53 contains a delay fluctuation caused by a temperature change in the optical fiber transmission line 10. Hence, it is possible to use, as the clock signal, the electrical signal generated by the photo detector 31 from the optical pulse stream $S_L$ that is locally generated in synchronization with the incoming optical signal pulse stream $S_{IN}$ according to the present invention. Since the phase-locked loop PLL contains the local optical pulse source 52 of a relatively long path length, however, the response speed of the phase-locked loop PLL is low accordingly. In view of this, the embodiment described below is adapted so that the clock signal synchronized with the incoming optical signal pulse stream $S_{IN}$ can be extracted at a high response speed in the incoming signal component generation part 20.

Figure 11:
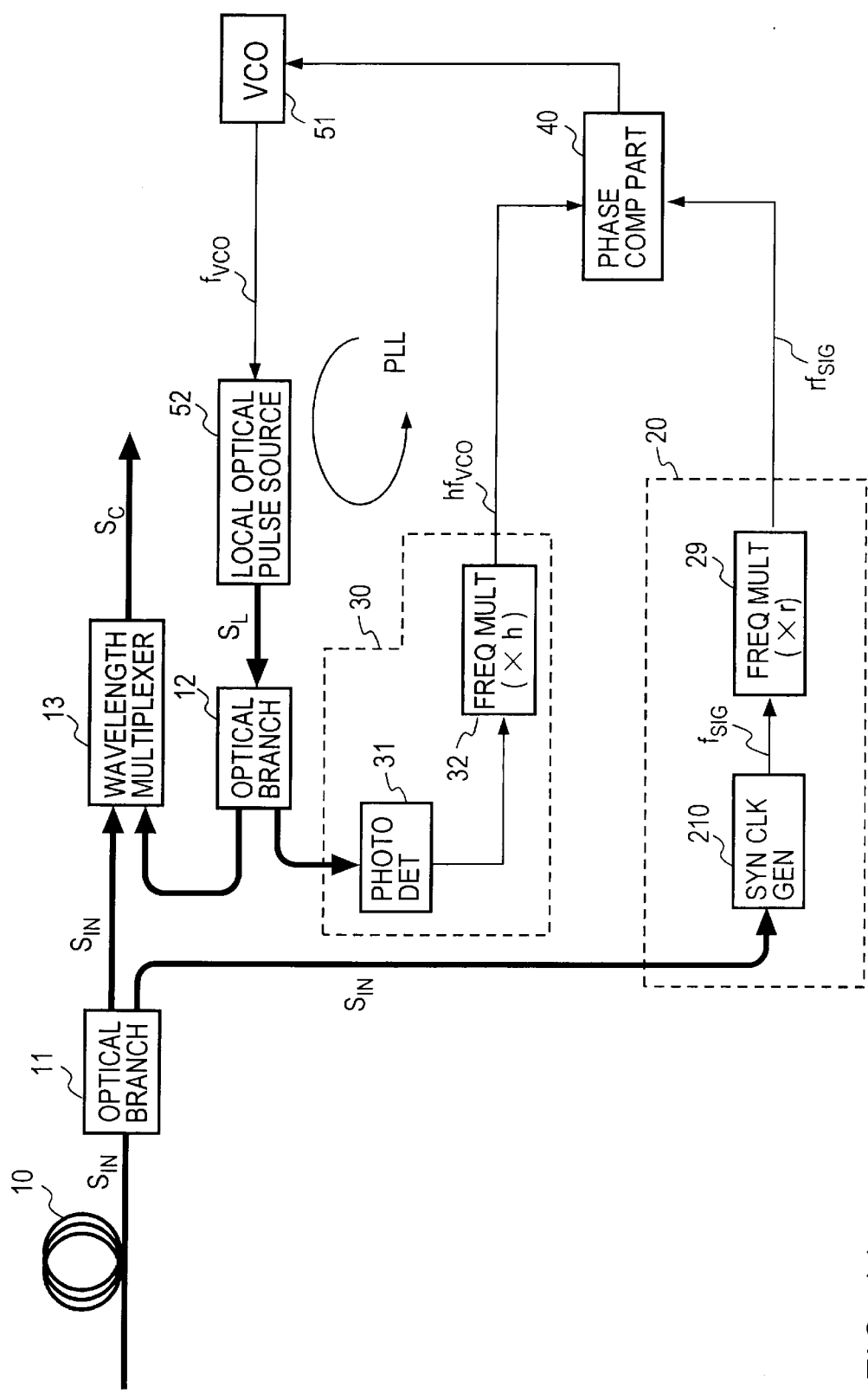
FIG. 11 is a a block diagram illustrating a bit-phase synchronized optical pulse stream local generator according to a sixth embodiment of the present invention.

FIG. 11 illustrates in block form a sixth embodiment of the present invention, in which the incoming signal component generation part 20 is provided independently of the harmonic component local generation part 30. The incoming signal component generation part 20 comprises: a synchronized clock signal generation part 210 that is supplied with the branched incoming optical signal pulse stream $S_{IN}$ from the optical branching device 11 and outputs a clock signal of a frequency $f_{SIG}$ synchronized with the incoming optical signal pulse stream $S_{IN}$; and a frequency multiplier 29 that multiplies the clock signal r-fold and outputs the r-multiplied clock signal as the incoming-signal-component electrical signal of a frequency $rf_{SIG}$. As is the case with the FIG. 5 embodiment, the output from the incoming signal component generation part 20 and the output from the harmonic component generation local part 30 are applied to the phase comparator 40, which generates the voltage corresponding to the phase difference and provides it to the voltage-controlled oscillator 51 forming the phase-locked loop PLL containing the local optical pulse source 52. A description will be given, with reference to FIGS. 12 to 16, of concrete examples of the synchronized clock signal generation part 210.

Figure 12:
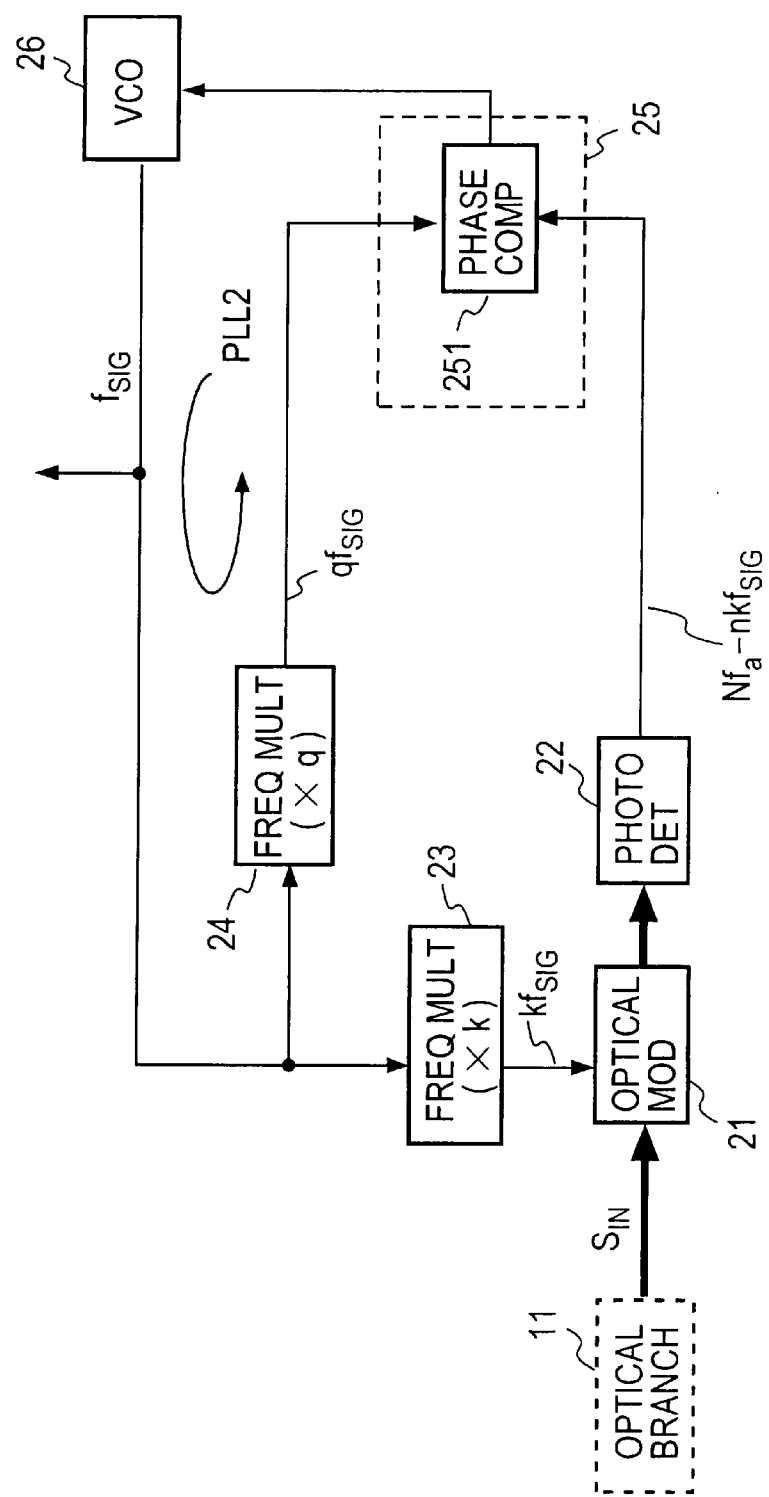
FIG. 12 is a block diagram depicting a first concrete example of a synchronized clock signal generator 210 in the FIG. 11 embodiment.

The synchronized clock signal generation part 210 depicted in FIG. 12 comprises an optical modulator 21, a photo detector 22, frequency multipliers 23 and 24, a phase comparison part 25, and a voltage-controlled oscillator 26. In this example the phase comparison part 25 is composed of a phase comparator 251 alone. The voltage-controlled oscillator 26 generates a signal of the frequency $f_{SIG}$ that has its phase controlled by the control voltage from the phase comparison part 25, and applies the signal to the frequency multipliers 23 and 24. The frequency multipliers 23 and 24 multiply the signal k- and q-fold, respectively, and output signals of frequencies $kf_{SIG}$ and $qf_{SIG}$.

The optical modulator 21 modulates the incoming optical signal pulse stream $S_{IN}$ from the optical branching device 11 by the signal of the frequency $kf_{SIG}$ from the frequency multiplier 23 and provides the modulated output to the photo detector 22. As a result, the photo detector 22 provides at its output an electrical signal having its frequency downconverted to $Nf_a-nkf_{SIG}$. The values of the constants N, n, q and k are preset such that the frequencies $qf_{SIG}$ and $Nf_a-nkf_{SIG}$ of the two input signals to the phase comparators 251 are equal to each other, and consequently, such that the voltage-controlled oscillation frequency $f_{SIG}$ is equal to $Nf_a/(q+nk)$ and that the value of $N/(q+nk)$ is a natural number.

The phase comparator 251 compares the phases of the output signal from the frequency multiplier 24 and the output signal from the photo detector 22, and provides the voltage corresponding to the phase difference between them, as the control voltage, to the voltage-controlled oscillator 51. Accordingly, the phase comparison part 25, the voltage-controlled oscillator 26 and the frequency multiplier 24 constitute a phase-locked loop PLL2, and the signal of the frequency $f_{SIG}$ that is output from the voltage-controlled oscillator 26 is a signal synchronized with the incoming optical signal pulse stream $S_{IN}$ retaining the delay fluctuation caused in the optical fiber transmission line 10. The output signal from the voltage-controlled oscillator 26 is applied to the frequency multiplier 29 in FIG. 11. If necessary, this output signal can be used as the aforementioned clock signal for level decision use.

According to the circuit arrangement of FIG. 12, the phase-locked loop PLL2 is made up of only the frequency multiplier 24, the phase comparison part 25 and the voltage-controlled oscillator 26. The phase-locked loop PLL2 has a shorter loop length than does the phase-locked loop PLL in FIG. 5, and hence its pull-in rate is high; accordingly, the output signal from the voltage-controlled oscillator 26 can be used as a fast-response synchronized clock signal.

Figure 13:
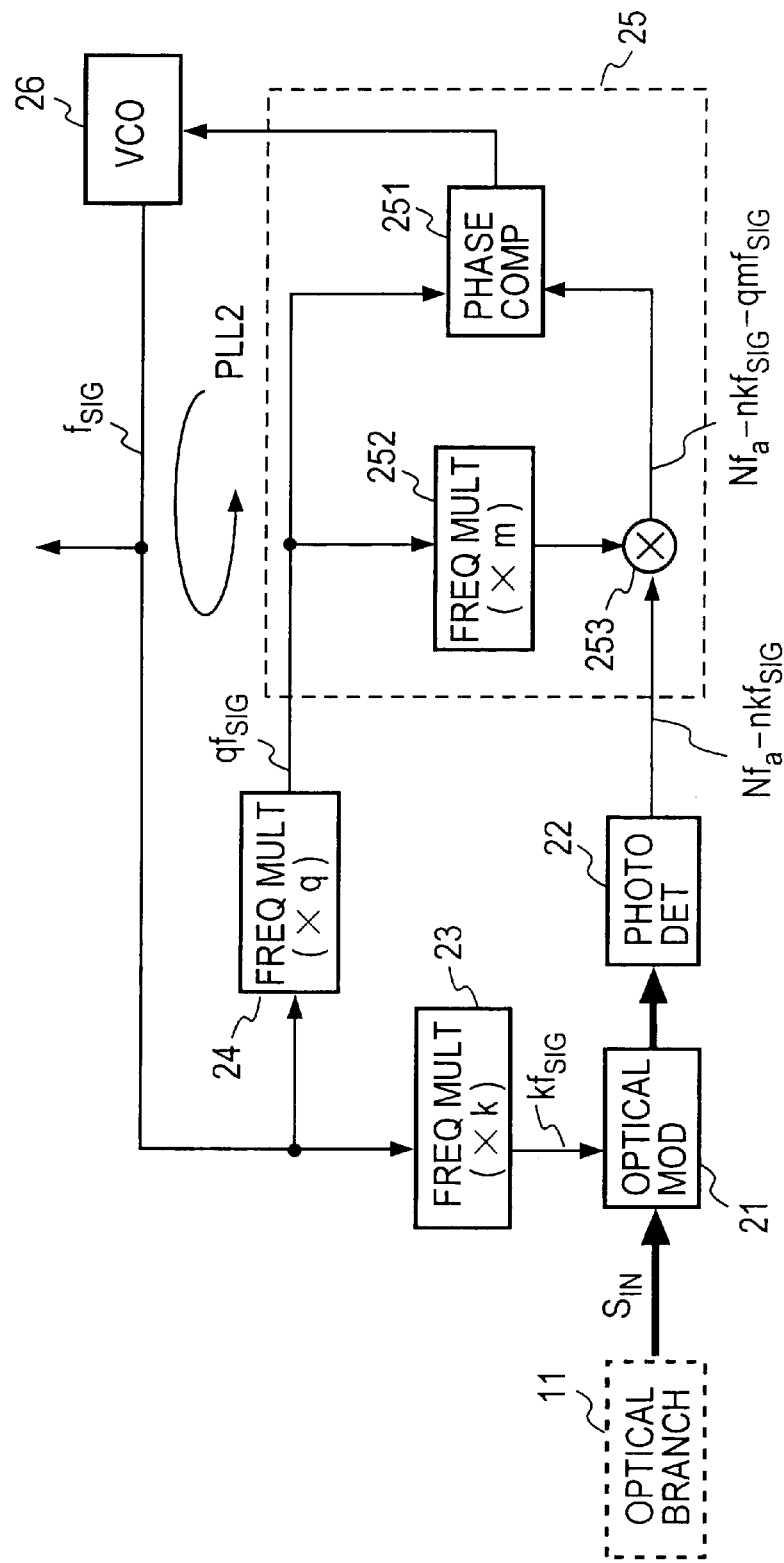
FIG. 13 is a block diagram depicting a second concrete example of the synchronized clock signal generator 210 in the FIG. 11 embodiment.

FIG. 13 illustrates in block form another example of the synchronized clock signal generator 210, which differs from the FIG. 12 example only in that a frequency multiplier 252 and a mixer 253 are additionally provided in the phase comparison part 25. The output from the frequency multiplier 24 is applied to the frequency multiplier 252 and the phase comparator 251 in the phase comparison part 25, and the frequency multiplier 252 multiplies m-fold the signal of the frequency $qf_{SIG}$ from the frequency multiplier 24, and provides the m-multiplied signal to the mixer 253. The mixer 253 is supplied with the signal of the frequency $Nf_a-nkf_{SIG}$ from the photo detector 22 and the signal of the frequency $mqf_{SIG}$ from the frequency multiplier 252, and provides a signal of the difference frequency $Nf_a-nkf_{SIG}-mqf_{SIG}$ to the phase comparator 251. In this embodiment the values of the constants N, n, m, k and q are preset such that the frequencies $qf_{SIG}$ and $Nf_a-nkf_{SIG}-qmf_{SIG}$ of the two input signals to the phase comparators 251 are equal to each other, and consequently, such that the voltage-controlled oscillation frequency $f_{SIG}$ is equal to $Nf_a/(nk+qm+q)$ and that the value of $N/(nk+qm+q)$ is a natural number.

Figure 14:
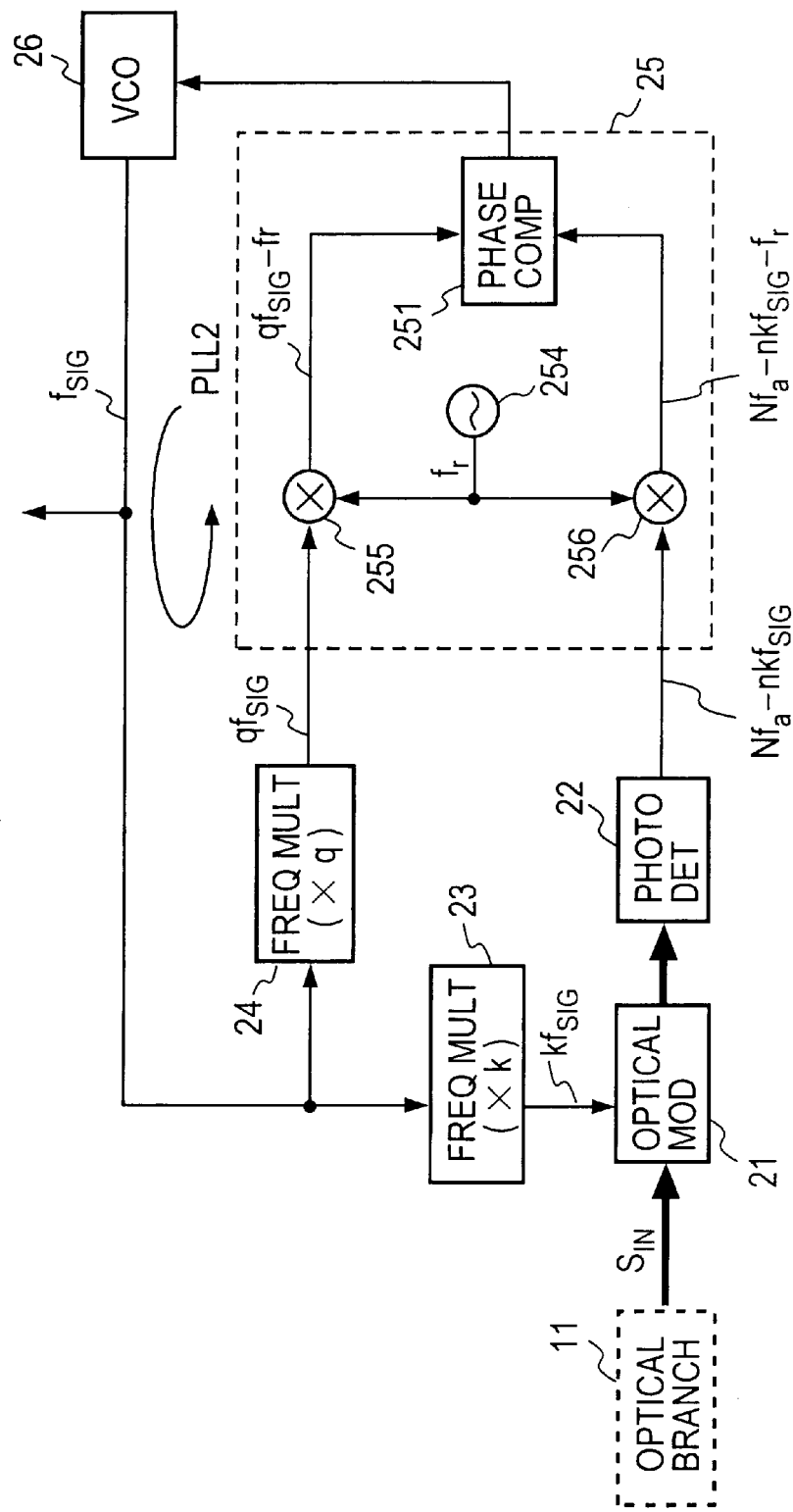
FIG. 14 is a block diagram depicting a third concrete example of the synchronized clock signal generator 210 in the FIG. 11 embodiment.

FIG. 14 illustrates in block form another example of the synchronized clock signal generator 210, in which mixers 255 and 256 are each connected to one of the two inputs of the phase comparator 251 in the phase comparison part 25 in FIG. 12 and a reference signal of a frequency $f_r$ is applied from a reference signal source 254 to the mixers 255 and 256. Accordingly, the phase comparator 251 is supplied with signals of frequencies $Nf_a-nkf_{SIG}-f_r$ and $qf_{SIG}-f_r$, and compares their phases. In this embodiment, since the values of the constants N, n, k and q are preset such that the frequencies $Nf_a-nkf_{SIG}-f_r$ and $qf_{SIG}-f_r$ of the two input signals to the phase comparators 251 are equal to each other, $Nf_a=(nk+q)f_{SIG}$ as is the case with FIG. 13, and consequently, $f_{SIG}=Nf_a/(nk+qm+q)$. And the constants N, n k and q are chosen such that the value of N/(nk+q) is a natural number.

Figure 15:
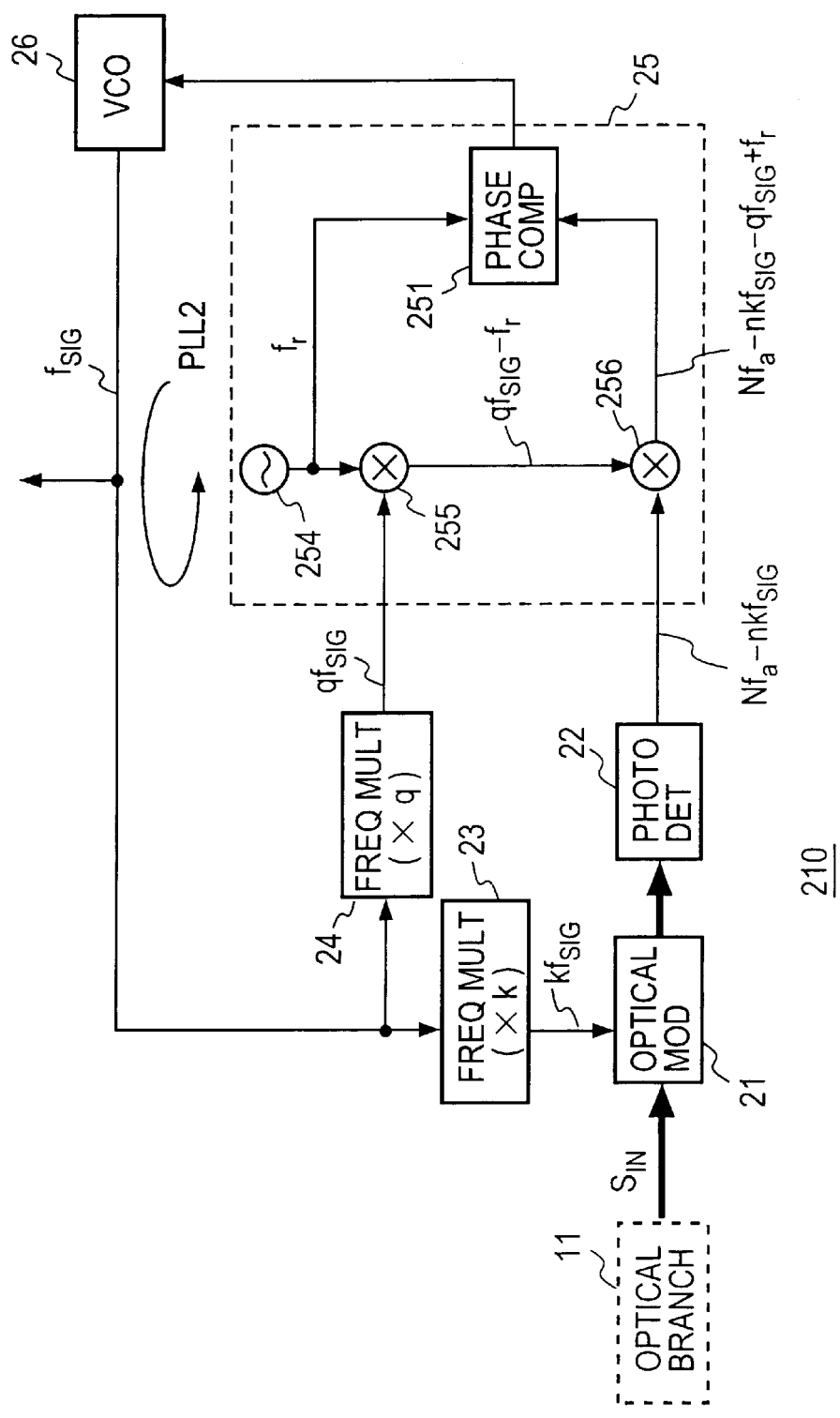
FIG. 15 is a block diagram depicting a fourth concrete example of the synchronized clock signal generator 210 in the FIG. 11 embodiment.

FIG. 15 illustrates in block form another example of the synchronized clock signal generator 210, in which mixers 255 and 256 and a reference signal source 254 are additionally provided in the phase comparison part 25 in FIG. 12. The outputs from the photo detector 22 and the frequency multipliers 24 are fed to the mixers 256 and 255, respectively. The reference signal of the frequency $f_r$ from the reference signal source 254 is applied to the phase comparator 251 and the mixer 255 as well. In the mixer 255 the reference signal is frequency-mixed with the signal fed from the frequency multiplier 24 to generate a signal of the difference frequency $qf_{SIG}-f_r$. The output from the mixer 255 is applied to the mixer 256, wherein it is mixed with the signal from the photo detector 22 to thereby extract a signal of the difference frequency $Nf_a-nkf_{SIG}-qf_{SIG}+f_r$, which is applied to the phase comparator 251. The values of the constants N, n, k and q are predetermined such that the frequencies $Nf_a-nkf_{SIG}-qf_{SIG}+f_r$ and $f_r$ of the two input signals to the phase comparator 251 are equal to each other. Accordingly, as is the case with the FIG. 13 example, the oscillation frequency $f_{SIG}$ of the voltage-controlled oscillator 26 is equal to $Nf_a/(nk+q)$.

Figure 16:
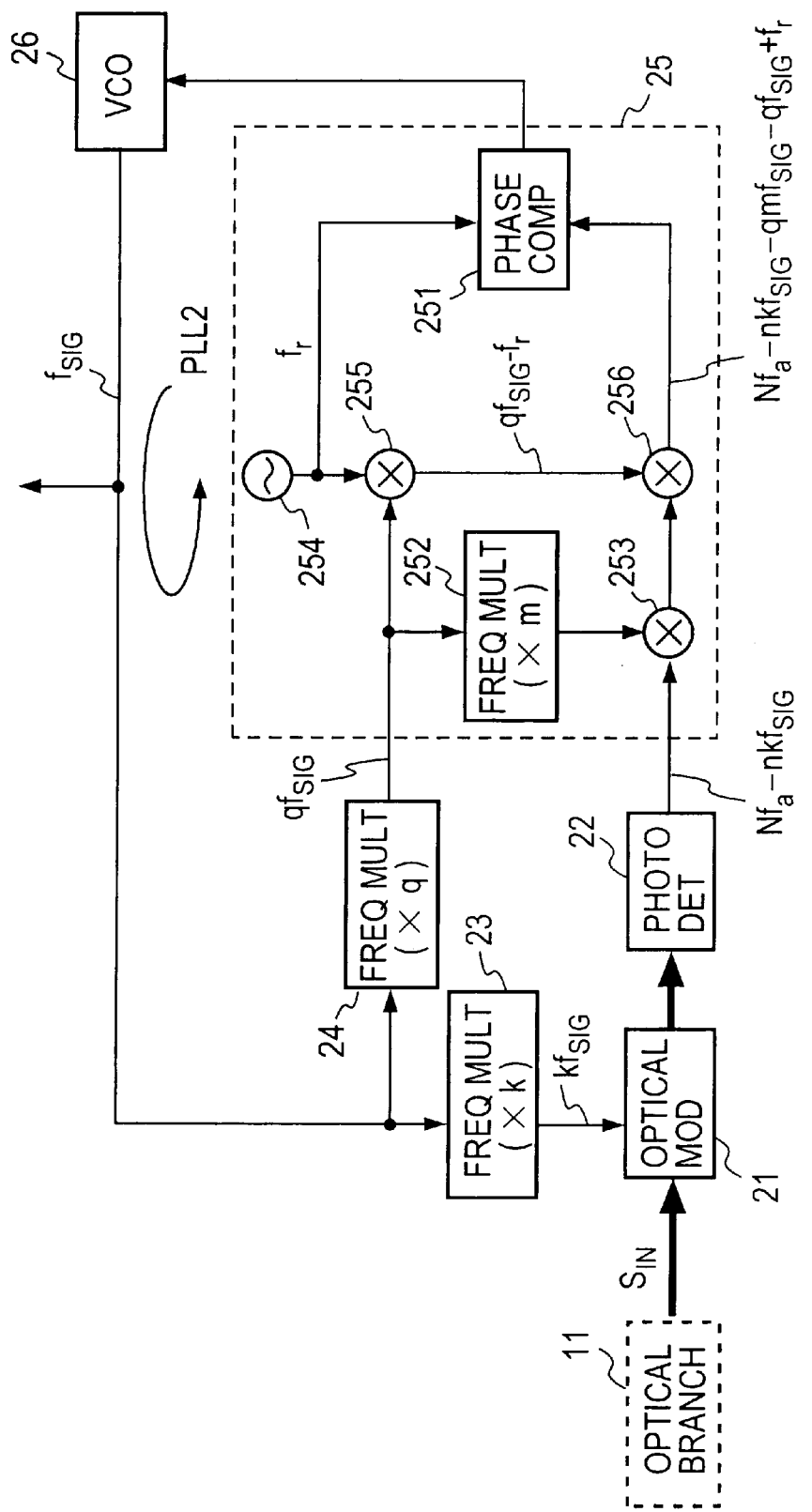
FIG. 16 is a block diagram depicting a fifth concrete example of the synchronized clock signal generator 210 in the FIG. 11 embodiment.

FIG. 16 illustrates in block form still another example of the synchronized clock signal generator 210, which is a modification of the phase comparison part 25 in FIG. 15. Interposed between the photo detector 22 and the mixer 256 is a mixer 253, to which is applied the output from the frequency multiplier 252 that performs m-fold multiplication of the output from the frequency multiplier 24. In this example, the values of the constants N, n, m, k and q are predetermined such that the frequencies $Nf_a-nkf_{SIG}-qmf_{SIG}-qf_{SIG}+f_r$ and fr of the two input signals to the phase comparator 251 are equal to each other, and consequently, such that $f_{SIG}=Nf_a/(nk+qm+q)$ and that the value of N/(nk+qm+q) is a natural number.

Incidentally, the synchronized clock signal generators 210 depicted in FIGS. 12 to 16 basically correspond to the structures in which the local optical pulse source 52 and the optical-electrical converting means connected thereto are removed from the local bit-phase synchronized optical pulse stream local generators shown in FIGS. 5 and 7 to 10. The electric clock signal generated is synchronized with the incoming optical signal pulse stream.

Seventh Embodiment

Figure 17:
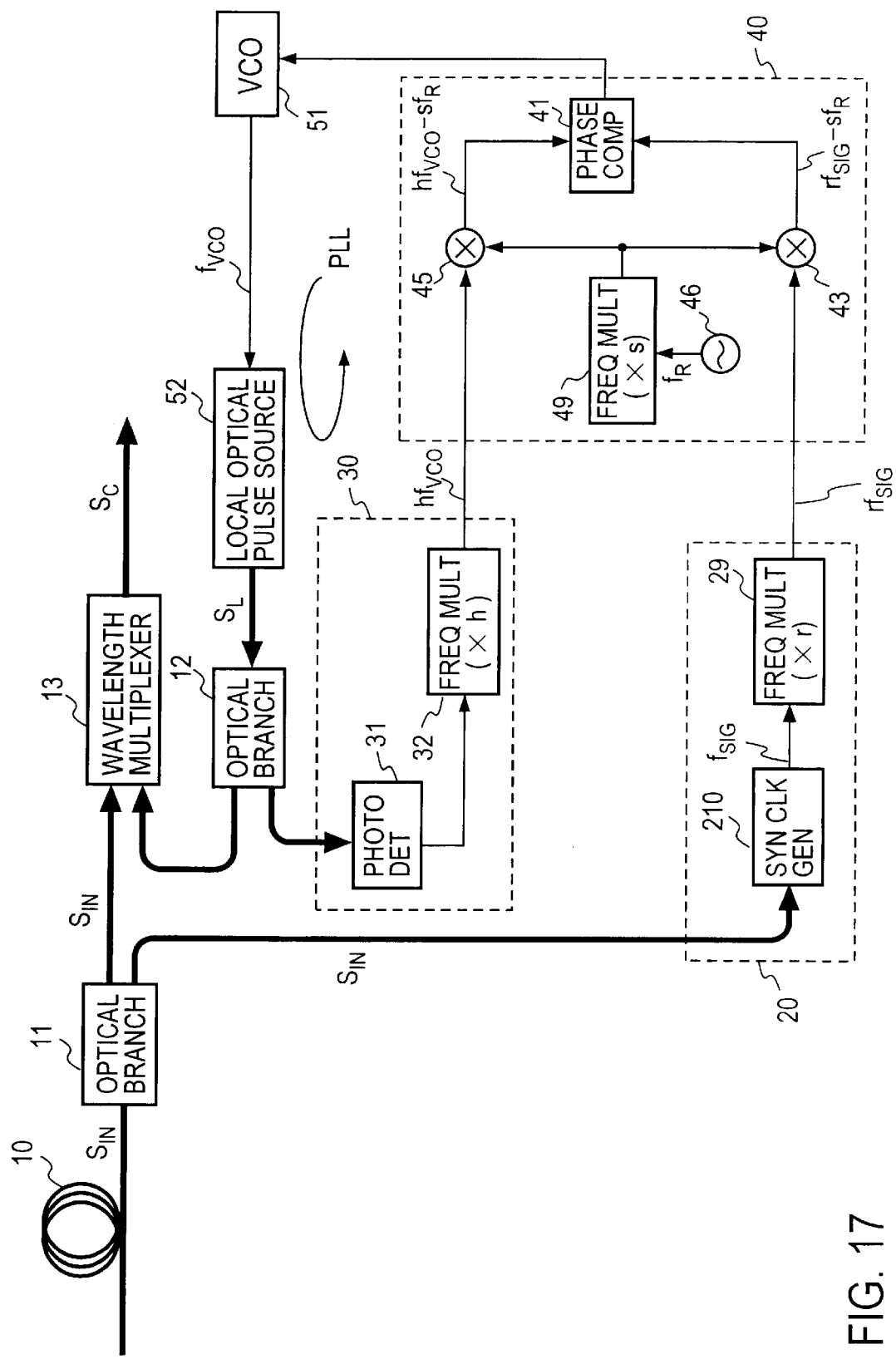
FIG. 17 is a block diagram illustrating a bit-phase synchronized optical pulse stream local generator according to a seventh embodiment of the present invention.

FIG. 17 illustrates in block a modified form of the FIG. 11 embodiment, in which the mixers 43 and 45, the reference signal source 46 and the frequency multiplier 49 are additionally provided in the phase comparison part 40 in FIG. 11. The reference signal of the frequency $f_R$ from the reference signal source 46 is applied to the frequency multiplier 49, wherein it is multiplied s-fold, the s-multiplied signal being applied to the mixers 45 and 43. The mixer 43 mixes the signal of the frequency $rf_{SIG}$ from the incoming signal component generation part 20 and the signal of the frequency $sf_R$ from the frequency multiplier 49 to generate a signal of the difference frequency $rf_{SIG}-sf_R$, which is applied to the phase comparator 41. The mixer 45 mixes the signal of the frequency $hf_{VCO}$ from the harmonic component local generation part 30 and the signal of the frequency $sf_R$ from the frequency multiplier 49 to generate a signal of the difference frequency $hf_{VCO}-sf_R$, which is applied to the phase comparator 41. The values of the constants h, s and r are predetermined such that the frequencies $hf_{VCO}-sf_R$ and $rf_{SIG}-sf_R$ of the two input signals to the phase comparator 41 are equal to each other, and consequently, such that $f_{VCO}=rf_{SIG}/h$. The operation of the phase-locked loop PLL is the same as described previously with reference to FIGS. 5 and 11. The synchronized clock signal generator 210 in the FIG. 17 embodiment may be any of those depicted in FIGS. 12, 13, 14, 15 and 16.

Eighth Embodiment

Figure 18:
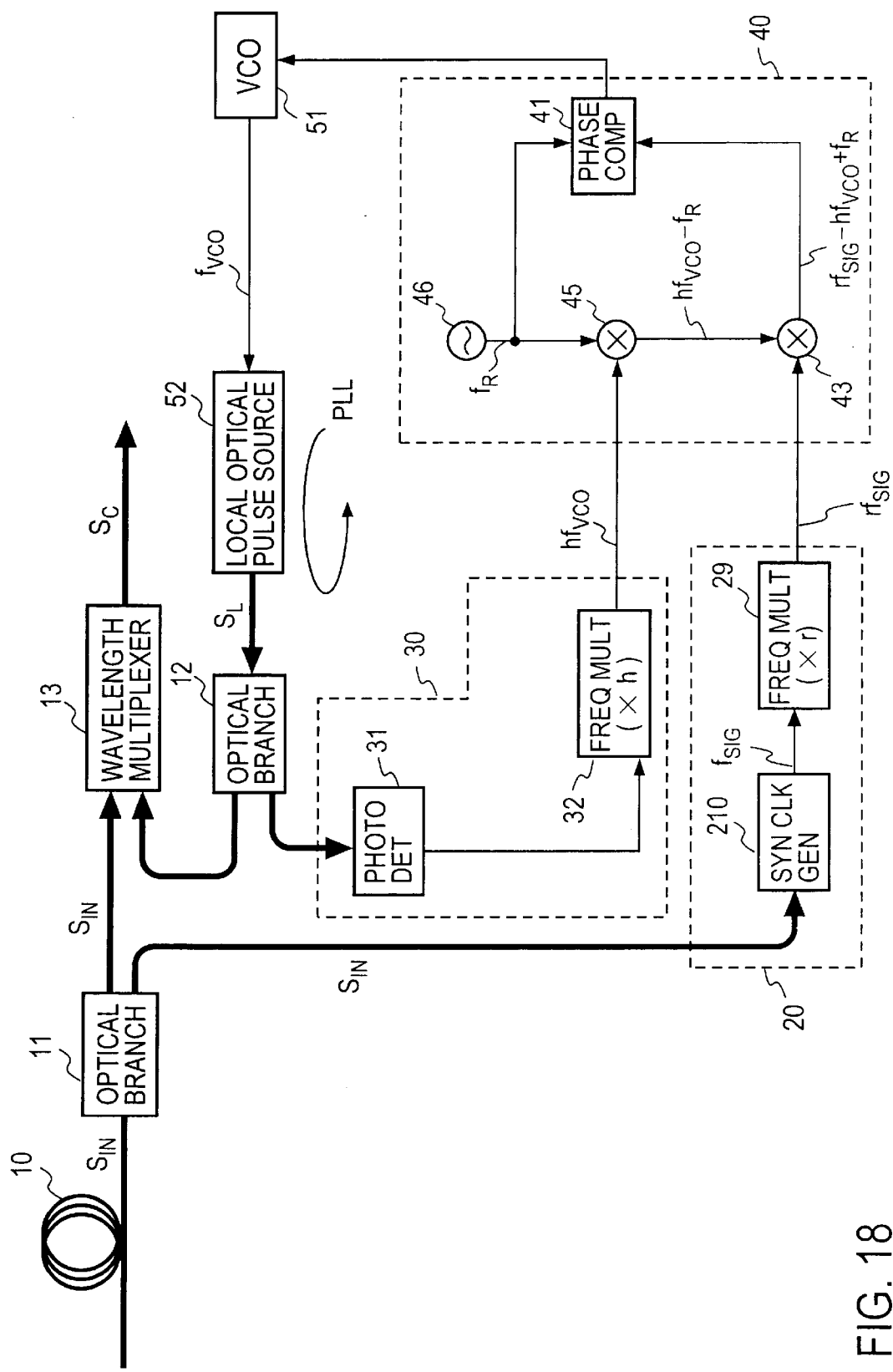
FIG. 18 is a block diagram illustrating a bit-phase synchronized optical pulse stream local generator according to an eighth embodiment of the present invention.

FIG. 18 illustrates in block form another modification of the FIG. 11 embodiment, in which the mixers 43 and 45 and the reference signal source 46 are additionally provided in the phase comparison part 40 in FIG. 11. The reference signal of the frequency $f_R$ from the reference signal source 46 is applied to the mixer 45 and to the phase comparator 41 as well. The mixer 45 mixes the signal of the frequency $hf_{VCO}$ from the harmonic component local generation part 30 and the signal of the frequency $f_R$ from the reference signal source 46 to generate a signal of the difference frequency $hf_{VCO}-f_R$, which is provided to the mixer 43. The mixer 43 mixes the signal of the frequency $rf_{SIG}$ from the incoming signal component generation part 20 and the signal of the frequency $hf_{VCO}-f_R$ from the mixer 45 to generate a signal of the difference frequency $rf_{SIG}-hf_{VCO}+f_R$, which is applied to the phase comparator 41. The values of the constants h and r are predetermined such that the frequencies $rf_{SIG}-hf_{VCO}+f_R$ and $f_R$ of the two input signals to the phase comparator 41 are equal to each other, and consequently, such that $f_{VCO}=rf_{SIG}/h$. The operation of the phase-locked loop PLL is the same as described previously with reference to FIGS. 5 and 11. The synchronized clock signal generator 210 in the FIG. 17 embodiment, too, may be any of those depicted in FIGS. 12, 13, 14, 15 and 16.

Figure 19A:
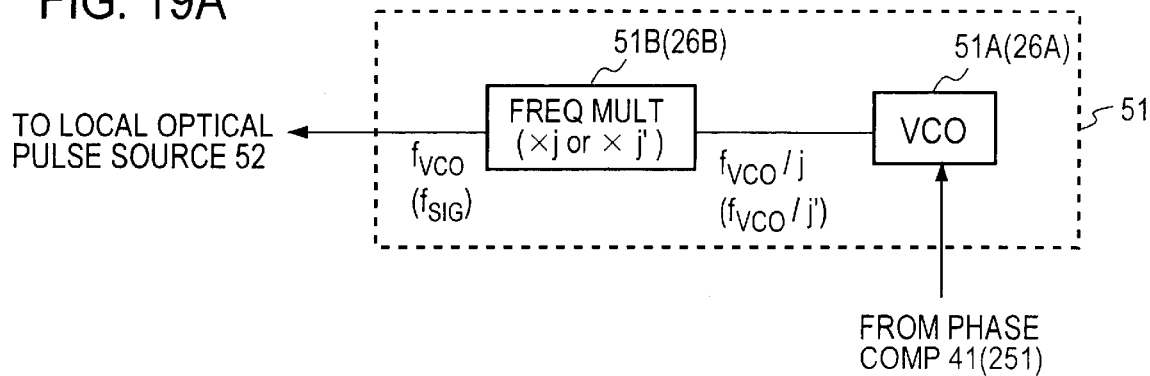
FIG. 19A is a block diagram depicting a modified form of a voltage-controlled oscillator 51 in the bit-phase synchronized optical pulse stream local generator according to the present invention.

FIG. 19A depicts a modified form of the voltage-controlled oscillator 51 in the bit-phase synchronized optical signal pulse stream local generator used in each of the embodiments FIGS. 5, 7 to 10, 11, 17 and 18. In FIG. 19A the voltage-controlled oscillator 51 is formed by a combination of a voltage-controlled oscillator part 51A of a lower oscillation frequency and a frequency multiplier 51B.

Figure 19B:
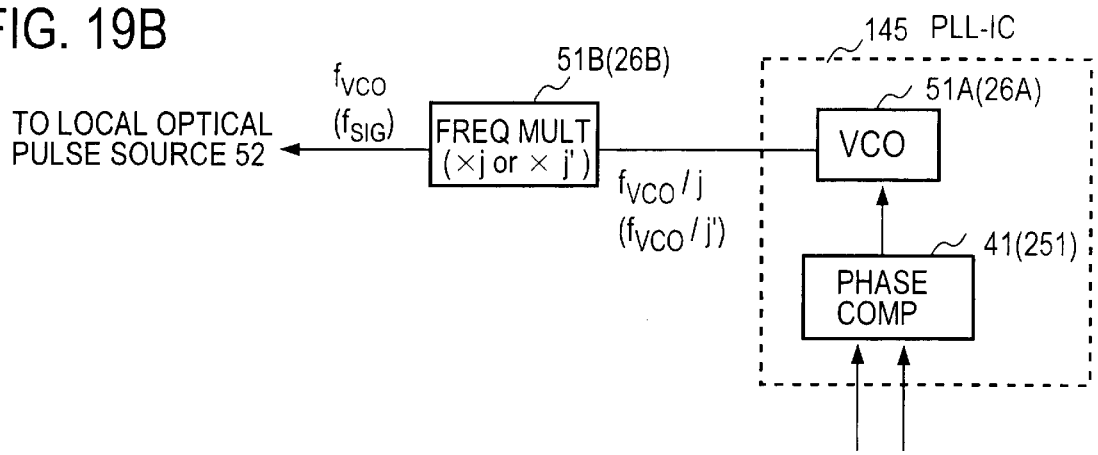
FIG. 19B is a block diagram depicting a part of the bit-phase synchronized optical pulse stream local generator of the present invention that uses a PLL-IC.

In the bit-phase synchronized optical signal pulse stream local generator 100 using the voltage-controlled oscillator 51 depicted in FIG. 19A, it is possible to employ a commercially available PLL-IC having the voltage-controlled oscillator part 51A and the phase comparator 41 formed as a unitary structure as depicted in FIG. 19B.

In a common PLL-IC the voltage-controlled oscillator part 51A and the phase comparator 41 are integrated on one chip, therefore, in the bit-phase synchronized optical signal pulse stream local generator 100 the voltage-controlled oscillator part 51A and the phase comparator 41 can be replaced with one PLL-IC 145. On the other hand, the synchronized clock signal generator 210 in the embodiments of FIGS. 11, 17 and 18 has the phase-locked loop PLL2 by which the synchronized clock signal, bit-phase synchronized with the incoming optical signal pulse stream having a delay fluctuation attributable to a delay fluctuation in the transmission line, can be extracted at a high response speed as shown in FIGS. 12 to 16. In the synchronized clock signal generator 210, too, the voltage-controlled oscillator 26 may be formed by a voltage-controlled oscillator part 26A of a low oscillation frequency $f_{VCO}/j'$ and a j' frequency multiplier 26B as is the case with FIG. 19A. The voltage-controlled oscillator part 26A and the phase comparator 251 may be formed by a single PLL-IC as depicted in FIG. 19B.

Thus, in the embodiments of FIGS. 5, 7 to 10, 11, 17 and 18, the reduction of the frequencies of the electrical signals for phase comparison permits the use of stable, high-performance PLL-ICs. Furthermore, the hold range of the phase-locked loop can be enlarged. Since the operating frequency of a high-performance digital PLL circuit at present is about 800 MHz at the highest, it is important, from this point of view, too, to reduce the frequencies of the electrical signals for phase comparison.

Moreover, the voltage-controlled oscillators 51 and 26 can each be substituted with a combination of a voltage-controlled oscillation part of a lower oscillation frequency (51A, 26A) and a frequency multiplier (51B, 26B). This permits reduction of the oscillation frequency of the voltage-controlled oscillator, hence allowing the use of a low-cost, high-performance voltage-controlled oscillator. By using a PLL-IC with the phase comparator and the voltage-controlled oscillator integrated thereon, it is possible to accomplish integration of the overall circuit structure, by which the bit-phase optical signal pulse stream local generator can be made stable, high-reliability and low-cost.

Ninth Embodiment

Figure 20:
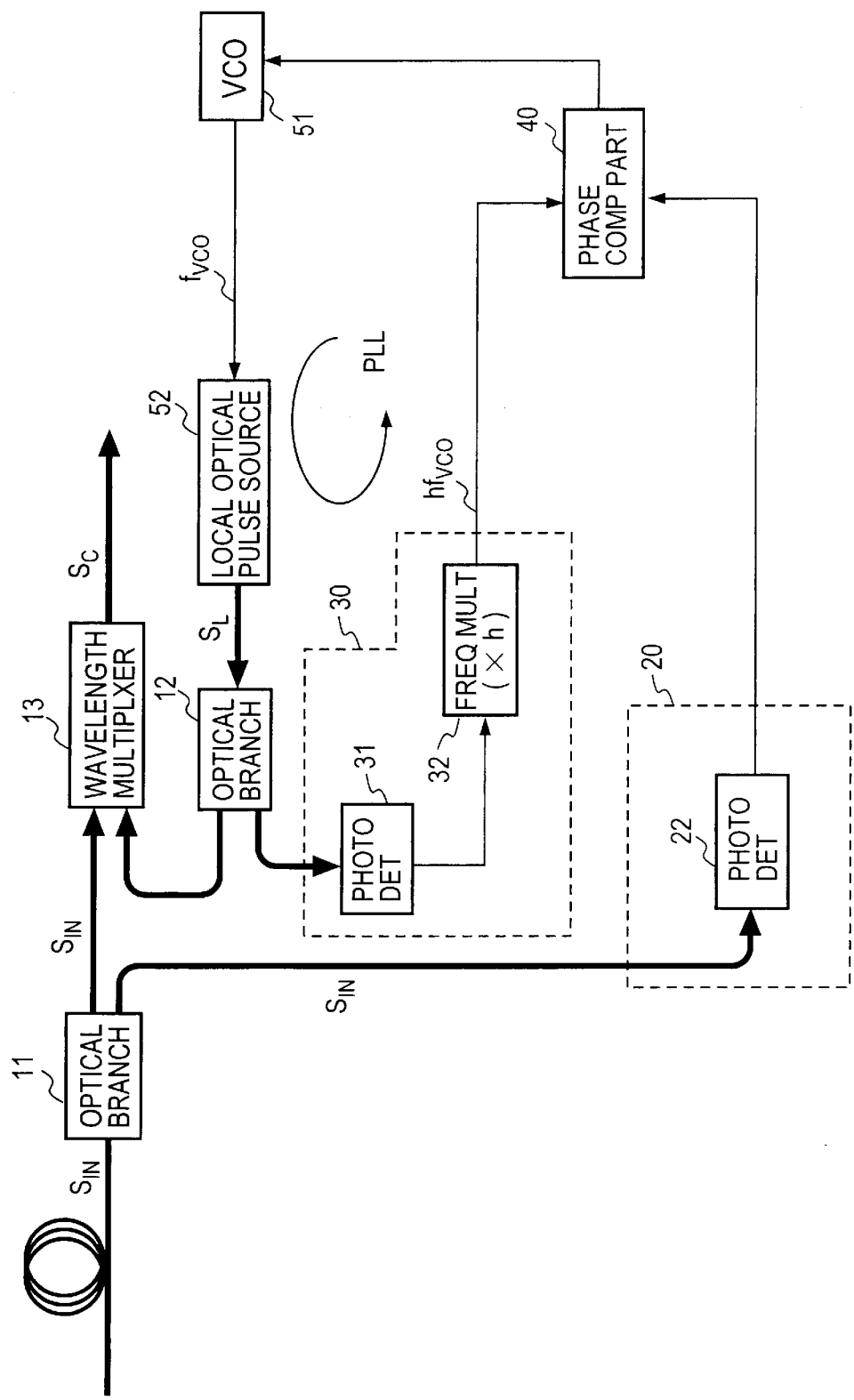
FIG. 20 is a block diagram illustrating still another embodiment of the bit-phase synchronized optical pulse stream local generator according to the present invention.

FIG. 20 illustrates in block form a ninth embodiment of the present invention. In the bit-phase synchronized optical signal pulse stream local generator 100 of each of the first to eighth embodiments, the reduction of the frequencies of the electrical signals to be applied to the phase comparison part 40 enables the use of a low-cost but high-accuracy phase comparator or a PLL-IC containing it. However, if the phase comparator 41 operates stably and with high accuracy even at a frequency exceeding 100 Gbits/s and if the cost of the phase comparator 41 need not be taken into account, or if the bit-rate of the incoming optical signal pulse stream $S_{IN}$ is sufficiently lower than 100 Gbits/s, the incoming optical signal pulse stream $S_{IN}$ need not be downconverted in the incoming signal component generation part 20 but it can be converted intact by the photo detector 22 to an electrical signal and applied to the phase comparison part 40 formed by the phase comparator 41 alone as depicted in FIG. 20. That is, in the FIG. 5 embodiment the optical modulator 21 and the frequency multiplier 23 from the incoming signal component generation part 20, and the incoming signal light $S_{IN}$ from the optical branching device 11 is input directly to the photo detector 22. Accordingly, in this instance, the values of the constants N and h are preset such that the frequencies $Nf_a$ and $hf_{VCO}$ of the two input signals to the phase comparator 41 are equal to each other and that the value of N/h is a natural number. The oscillation frequency of the voltage-controlled oscillator 51 is $f_{VCO}=Nf_a/h$ in this case.

Effect of the Invention

As described above, according to the present invention, the local optical pulse source 52 is inserted in the phase-locked loop for phase synchronization with the incoming-signal-component electrical signal derived from the incoming optical signal pulse stream $S_{IN}$. The output from the local optical pulse source 52 is branched into two, the one of which is output as a locally generated bit-phase synchronized optical pulse stream (optical control pulse stream) $S_L$. And the locally generated harmonic component electrical signal generated from the other branched output of the local optical pulse source 52 is applied to the phase comparator 41. Hence, it is possible to suppress a delay fluctuation of the optical pulse in the local optical pulse source 52.

Figure 21:
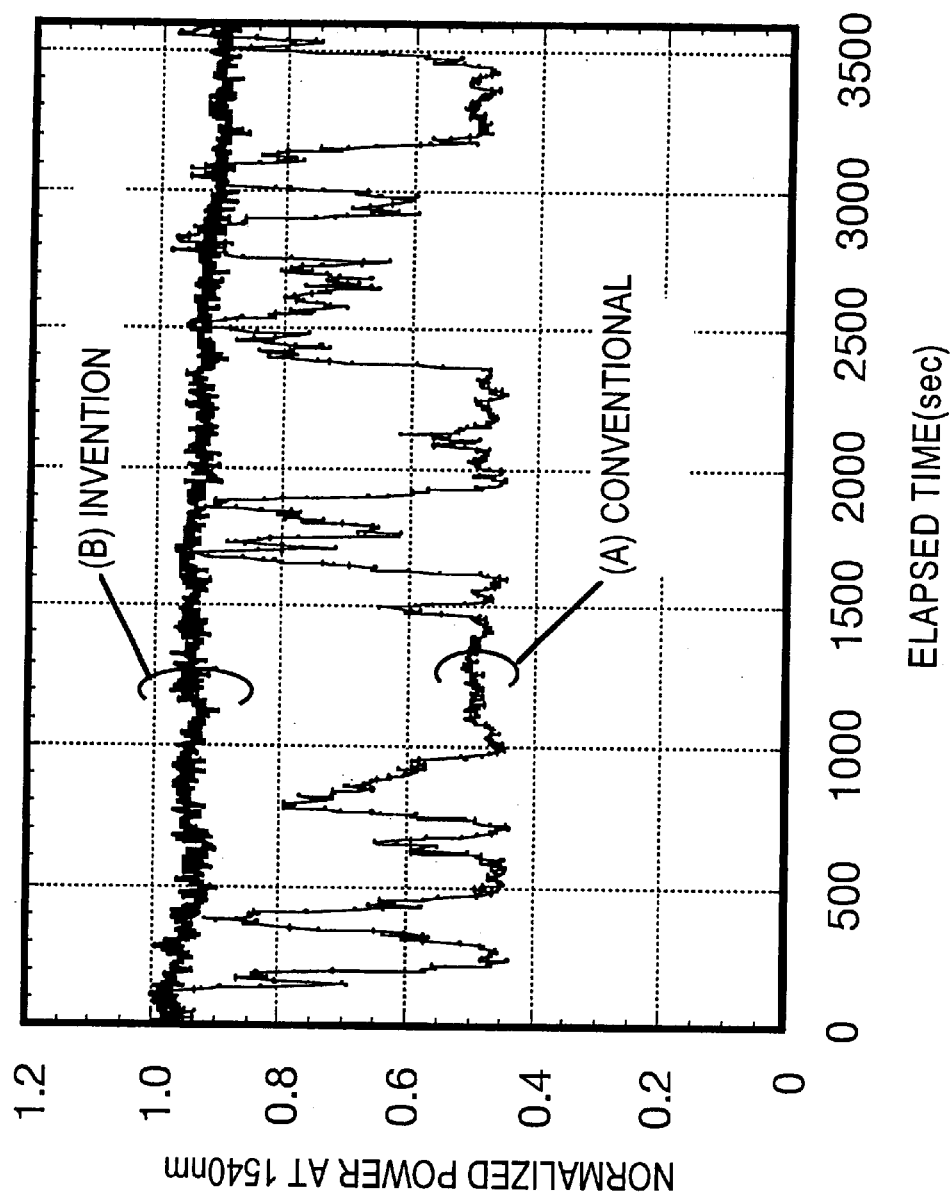
FIG. 21 is a graph showing the bit-phase synchronization characteristic of the bit-phase synchronized optical pulse stream local generator according to the present invention in comparison with the bit-phase synchronization characteristic in the case of using the prior art scheme.

FIG. 21 is a graph in which (A) indicates measured results of the normalized power of the demultiplexed signal SD by the conventional time-division demultiplexer of FIG. 2 and (B) indicates measured results of the normalized power of the demultiplexed signal SD when the bit-phase synchronized optical pulse stream local generator 100 in FIG. 2 was replaced with that of the FIG. 5 embodiment. The ordinate of the graph indicates normalized power and the abscissa indicates elapsed time. The repetition frequency of the incoming optical signal pulse stream is $Nf_a$=100 Gbits/s; the number of channels is N=10; and the optical signal pulse repetition frequency in each channel is $f_a$=10 Gbits/s. The multiplication numbers of the frequency multipliers 23 and 32 in the bit-phase synchronize optical signal pulse stream local generator 100 according to the present invention are k=4 and h=2, respectively. And a second-order one (n=2) of the outputs from the photo detector 22 was downconverted. As is evident from the graph, in the prior art the output power greatly varies because the locally generated optical pulse stream $S_L$ becomes out of synchronism with he incoming optical signal pulse stream $S_{IN}$ due to delay fluctuations in the former. In contrast thereto, it is shown that the use of the bit-phase synchronized optical pulse stream local generator of the present invention ensures stable demultiplexing without causing loss of synchronization between the two pulse streams $S_L$ and $S_{IN}$.

Thus, the present invention permits stable generation of an optical pulse stream bit-phase synchronized with an optical signal pulse stream of an ultrahigh repetition frequency in excess of 100 Gbits/s that is generated by optical time-division multiplexing.

Moreover, the present invention is applied to the generation of control light synchronized with incoming signal light that is essential to all ultrafst, all-optical control circuits utilizing the nonlinear optical effect, such as an all-optical time-division multiplexer, an all-optical time-division demultiplexer, an all-optical wavelength converter and an all-optical Add/Drop circuit. Since it is possible to stably generate an optical control pulse stream bit-phase synchronized with the incoming optical signal pulse stream, the intended channel can be kept in the ultrafst, all-optical control circuit. Hence, the present invention greatly contributes to stabilization of the operation for implementing the basic functions of the control circuit.

It will be apparent that many modifications and variations may be effected without departing from the scope of the novel concepts of the present invention.

What is claimed is:

1. A bit-phase synchronized optical pulse stream local generator for generating an optical pulse stream synchronized in bit phase with an incoming optical signal pulse stream, said local generator comprising:

a voltage-controlled oscillator for generating a local oscillation signal in a phase controlled by a control voltage;

a local optical pulse source driven by said local oscillation signal to generate an optical pulse stream;

an optical branching device for branching said locally generated optical pulse stream into first and second locally generated optical pulse streams and for outputting said first locally generated optical pulse stream as an optical control pulse stream synchronized in bit phase with said incoming optical signal pulse stream;

a harmonic component local generation part supplied with said second locally generated optical pulse stream, for generating a harmonic component electrical signal that contains a harmonic component of the frequency of said second locally generated optical pulse stream;

an incoming signal component generating part supplied with said incoming optical signal pulse stream, for generating an incoming signal component electrical signal that contains bit phase information of said incoming optical signal pulse stream; and a phase comparison part for comparing the phases of said locally generated harmonic component electrical signal and said incoming signal component electrical signal to generate a voltage corresponding to their phase difference for application as said control voltage to said voltage-controlled oscillator; and wherein a path containing said phase comparison part, said voltage-controlled oscillator, said local optical pulse source, said optical branching device and said harmonic component local generation part constitutes a phase-locked loop for said incoming signal component electrical signal.

2. The local generator of claim 1, wherein, letting the bit rate of said incoming optical signal pulse stream, the number of time-division multiplexed channels and the frequency of said local oscillation signal be represented by $Nf_a$, N and $f_{VCO}$, respectively, said harmonic component local generation part comprises: a first photo detector for converting said second locally generated optical pulse stream to a locally generated electric pulse stream of said frequency $f_{VCO}$; and a first frequency multiplier for multiplying h-fold the frequency of said locally generated electric pulse stream to generate said locally generated harmonic component electrical signal of a frequency $hf_{VCO}$; and said incoming signal component generation part comprises: a second frequency multiplier supplied with said locally generated electric pulse stream, for multiplying its frequency k-fold to generate a modulation signal of a frequency $kf_{VCO}$; an optical modulator supplied with said second incoming optical signal pulse stream, for modulating it by said modulation signal to generate a modulated incoming optical signal pulse stream; and a second photo detector supplied with said modulated incoming optical signal pulse stream, for generating said incoming signal component electrical signal of a downconverted frequency $Nf_a - nkf_{VCO}$, where said N, n, h and k are integers equal to or greater than 1.

3. The local generator of claim 2, wherein said phase comparison part comprises a phase comparator for comparing the phases of said locally generated harmonic component electrical signal of the frequency $hf_{VCO}$ and said incoming signal component electrical signal of the frequency $Nf_a - nkf_{VCO}$ to generate said control voltage corresponding to their phase difference, the values of said N, n, k and h being predetermined such that $hf_{VCO} = Nf_a - nkf_{VCO}$.

4. The local generator of claim 2, wherein said phase comparison part comprises a third frequency multiplier for multiplying m-fold said locally generated harmonic component electrical signal of the frequency $hf_{VCO}$ to generate a signal of a frequency $mhf_{VCO}$, a mixer for mixing the output from said third frequency multiplier and said incoming signal component electrical signal to generate a signal of their difference frequency $Nf_a - nkf_{VCO} - mhf_{VCO}$, and a phase comparator for comparing the phases of said locally generated harmonic component electrical signal of the frequency $hf_{VCO}$ and said signal of the difference frequency $Nf_a - nkf_{VCO} - mhf_{VCO}$ to generate said control voltage corresponding to their phase difference, said n being an integer equal to or greater than 1 and the values of said N, n, k, h and m being predetermined such that $Nf_a - nkf_{VCO} - mhf_{VCO} = hf_{VCO}$.

5. The local generator of claim 2, wherein said phase comparison part comprises a reference signal source for outputting a reference signal of a frequency $f_R$, a first mixer for mixing said locally generated harmonic component electrical signal of the frequency $hf_{VCO}$ and said reference signal to generate a signal of their difference frequency $hf_{VCO} - f_R$, a second mixer for mixing said incoming signal component electrical signal and said reference signal to generate a signal of their difference frequency $Nf_a - nkf_{VCO} - f_R$, and a phase comparator for comparing the phases of the outputs from said first and second mixers to generate said control voltage corresponding to their phase difference, the values of said N, n, h and k being predetermined such that $Nf_a - nkf_{VCO} - f_R = hf_{VCO} - f_R$.

6. The local generator of claim 2, wherein said phase comparison part comprises a reference signal source for outputting a reference signal of a frequency $f_R$, a first mixer for mixing said locally generated harmonic component electrical signal of the frequency $hf_{VCO}$ and said reference signal to generate a signal of their difference frequency $hf_{VCO} - f_R$, a second mixer for mixing said incoming signal component electrical signal and the output from said first mixer to generate a signal of their difference frequency $Nf_a - nkf_{VCO} - hf_{VCO} + f_R$, and a phase comparator for comparing the phases of said reference signal and the output from said second mixer to generate said control voltage corresponding to their phase difference, the values of said N, n, h and k being predetermined such that $Nf_a - nkf_{VCO} - hf_{VCO} + f_R = f_R$.

7. The local generator of claim 2, wherein said phase comparison part comprises a reference signal source for outputting a reference signal of a frequency $f_R$, a first mixer for mixing said locally generated harmonic component electrical signal of the frequency $hf_{VCO}$ and said reference signal to generate a signal of their difference frequency $hf_{VCO} - f_R$, a third frequency multiplier for multiplying m-fold the frequency $hf_{VCO}$ of said locally generated harmonic component electrical signal, a second mixer for mixing the output from said third frequency multiplier and said incoming signal component electrical signal to generate a signal of their difference frequency $Nf_a - nkf_{VCO} - mhf_{VCO}$, a third mixer for mixing the outputs from said first and second mixers to generate a signal of their difference frequency $Nf_a - nkf_{VCO} - mhf_{VCO} - hf_{VCO} + f_R$, and a phase comparator for comparing the phases of said reference signal and the output from said third mixer to generate said control voltage corresponding to their phase difference, said n being an integer equal to or greater than 1 and the values of said N, n, h, k and m being predetermined such that $Nf_a - nkf_{VCO} - mhf_{VCO} - hf_{VCO} + f_R = f_R$.

8. The local generator of claim 1, wherein, letting the bit rate of said incoming optical signal pulse stream, the number of time-division multiplexed channels and the frequency of said local oscillation signal be represented by $Nf_a$, N and $f_{VCO}$, respectively, said harmonic component local generation part comprises: a first photo detector for converting said second locally generated optical pulse stream to a locally generated electric pulse stream of said frequency $f_{VCO}$; and a first frequency multiplier for multiplying h-fold the frequency of said logically generated electric pulse stream to generate said locally generated harmonic component electrical signal of a frequency $hf_{VCO}$; and said incoming signal component generation part comprises: a synchronized clock signal generator for generating a synchronized clock signal of a frequency $f_{SIG}$ synchronized with said incoming optical signal pulse stream; and a second frequency multiplier for multiplying r-fold the frequency $f_{SIG}$ of said synchronized clock signal to generate a signal of a frequency $rf_{SIG}$ for application as said incoming signal component electrical signal to said phase comparison part, said N, h and r being integers equal to or greater than 1.

9. The local generator of claim 8, wherein said phase comparison part comprises a phase comparator for comparing the phases of said locally generated harmonic component electrical signal of the frequency $hf_{VCO}$ and said incoming signal component electrical signal of the frequency $rf_{SIG}$ to generate said control signal corresponding to their phase difference, the values of said h and r being predetermined such that the frequencies of said two electrical signals are $hf_{VCO}=rf_{SIG}$.

10. The local generator of claim 8, wherein said phase comparison part comprises a reference signal source for outputting a reference signal of a frequency $f_R$, a third frequency multiplier for multiplying s-fold the frequency $f_R$ of said reference signal to generate a signal of a frequency $sf_R$, a first mixer for mixing said locally generated harmonic component electrical signal and the output from said third frequency multiplier to generate a signal of their difference frequency $hf_{VCO}-sf_R$, a second mixer for mixing said incoming signal component electrical signal and said reference signal to generate a signal of their difference frequency $rf_{SIG}-sf_R$, and a phase comparator for comparing the phases of the outputs from said first and second mixers to generate said control voltage corresponding to their phase difference, the values of said h, r and s being predetermined such that $hf_{VCO}-sf_R=rf_{SIG}-sf_R$.

11. The local generator of claim 8, wherein said phase comparison part comprises a reference signal source for outputting a reference signal of a frequency $f_R$, a first mixer for mixing said locally generated harmonic component electrical signal of the frequency $hf_{VCO}$ and said reference signal to generate a signal of their difference frequency $hf_{VCO}-f_R$, a second mixer for mixing said incoming signal component electrical signal and the output from said first mixer to generate a signal of their difference frequency $rf_{SIG}-hf_{VCO}+f_R$, and a phase comparator for comparing the phases of said reference signal and the output from said second mixer to generate said control voltage corresponding to their phase difference, the values of said h and r being predetermined such that $rf_{SIG}-hf_{VCO}+f_R=f_R$.

12. The local generator of any one of claims 8 to 11, wherein said synchronized clock signal generator comprises:
   a synchronized clock voltage-controlled oscillator for generating said synchronized clock signal of the frequency $f_{SIG}$ phase-controlled according to synchronized clock control voltage;
   a synchronized clock first frequency multiplier for multiplying the frequency of said synchronized clock signal q-fold to generate a synchronized clock multiplied signal of a frequency $qf_{SIG}$;
   a synchronized clock second frequency multiplier for multiplying the frequency of said synchronized clock signal k-fold to generate a synchronized clock modulating signal of a frequency $kf_{SIG}$;
   a synchronized clock optical modulator for modulating said incoming optical signal pulse stream by said synchronized clock modulating signal to generate a modulated incoming optical signal pulse stream;
   a synchronized clock photo detector for downconverting said modulated incoming optical signal pulse stream from said synchronized clock optical modulator to a modulated incoming electrical signal pulse stream of a frequency $Nf_a-nkf_{SIG}$; and
   a synchronized clock phase comparison part for comparing the phases of said synchronized clock multiplied signal of the frequency $qf_{SIG}$ from said synchronized clock frequency multiplier and said modulated incoming electrical signal pulse stream of the frequency $Nf_a-nkf_{SIG}$ from said synchronized clock photo detector to generate said synchronized clock control voltage corresponding to their phase difference for application to said synchronized clock voltage-controlled oscillator, a path containing said synchronized clock phase comparison part, said synchronized clock voltage-controlled oscillator and said synchronized clock first frequency multiplier forming a synchronized clock phase-locked loop.

13. The local generator of claim 12, wherein said synchronized clock phase comparison part comprises a synchronized clock phase comparator for comparing the phases of said synchronized clock multiplied signal of the frequency $qf_{SIG}$ and said modulated incoming electrical signal pulse stream of the frequency $Nf_a-nkf_{SIG}$ to generate said synchronized clock control voltage corresponding to their phase difference, the values of said N, n, k and q being predetermined such that $qf_{SIG}=Nf_a-nkf_{SIG}$.

14. The local generator of claim 12, wherein said synchronized clock phase comparison part comprises a synchronized clock third frequency multiplier for multiplying m-fold the frequency of said synchronized clock multiplied signal of the frequency $qf_{SIG}$ to generate a m-multiplied signal of a frequency $mqf_{SIG}$, a synchronized clock mixer for mixing the output from said synchronized clock third frequency multiplier and said modulated incoming electrical signal pulse stream to generate a signal of their difference signal $Nf_a-nkf_{SIG}-mqf_{SIG}$, and a synchronized clock phase comparator for comparing the phases of said synchronized clock multiplied signal of the frequency $qf_{SIG}$ and said signal of the difference frequency $Nf_a-nkf_{SIG}-mqf_{SIG}$ to generate said synchronized clock control voltage corresponding to their phase difference, the values of said N, n, k, q, m being predetermined such that $Nf_a-nkf_{SIG}-mqf_{SIG}=qf_{SIG}$.

15. The local generator of claim 12, wherein said synchronized clock phase comparison part comprises a synchronized clock reference signal source for outputting a synchronized clock reference signal of a frequency $f_r$, a synchronized clock first mixer for mixing said synchronized clock multiplied signal of the frequency $qf_{SIG}$ and said synchronized clock reference signal to generate a signal of their difference frequency $qf_{SIG}-f_r$, a synchronized clock second mixer for mixing said modulated incoming electrical signal pulse stream and said synchronized clock reference signal to generate a signal of their difference frequency $Nf_a-nkf_{SIG}-f_r$, and a synchronized clock phase comparator for comparing the phases of the outputs from said synchronized clock first and second mixers to generate said synchronized clock control voltage corresponding to their phase difference, the values of said N, n, q and k being predetermined such that $Nf_a-nkf_{SIG}-f_r=qf_{SIG}-f_r$.

16. The local generator of claim 12, wherein said synchronized clock phase comparison part comprises a synchronized clock reference signal source for outputting a synchronized clock reference signal of a frequency $f_r$, a synchronized clock first mixer for mixing said synchronized clock multiplied signal of the frequency $qf_{SIG}$ and said synchronized clock reference signal to generate a signal of their difference frequency $qf_{SIG}-f_r$, a synchronized clock second mixer for mixing said modulated incoming electrical signal pulse stream and the output from said synchronized clock first mixer to generate a signal of their difference frequency $Nf_a-nkf_{SIG}-qf_{SIG}+f_r$, and a synchronized clock phase comparator for comparing the phases of said synchronized clock reference signal and the output from said synchronized second mixer to generate said synchronized clock control voltage corresponding to their phase difference, the values of said N, n, q and k being predetermined such that $Nf_a-nkf_{SIG}-qf_{SIG}+f_r=f_r$.

17. The local generator of claim 12, wherein said synchronized clock phase comparison part comprises a synchronized clock reference signal source for outputting a synchronized clock reference signal of a frequency $f_r$, a synchronized clock first mixer for mixing said synchronized clock multiplied signal of the frequency $qf_{SIG}$ and said synchronized clock reference signal to generate a signal of their difference frequency $qf_{SIG}-f_r$, a synchronized clock third frequency multiplier for multiplying m-fold the frequency $qf_{SIG}$ of said synchronized clock multiplied signal, a synchronized clock second mixer for mixing the output from said synchronized clock third frequency multiplier and said modulated incoming electrical signal pulse stream to generate a signal of their difference frequency $Nf_a-nkf_{SIG}-mqf_{SIG}$, a synchronized clock third mixer for mixing the outputs from said synchronized clock first and second mixers to generate a signal of their difference frequency $Nf_a-nkf_{SIG}-mqf_{SIG}-qf_{SIG}+f_r$, and a synchronized clock phase comparator for comparing the phases of said synchronized clock reference signal and the output from said synchronized clock third mixer to generate said synchronized clock control voltage corresponding to their phase difference, the values of said N, n, q, k and m being predetermined such that $Nf_a-nkf_{SIG}-mqf_{SIG}-qf_{SIG}+f_r=f_r$.

18. The local generator of any one of claims 3 to 7 and 9 to 11, wherein said voltage-controlled oscillator comprises a voltage-controlled oscillator part for generating a signal of a frequency $f_{VCO}/j$ phased-controlled by said control voltage and a j-frequency multiplier for multiplying the output frequency of said voltage-controlled oscillator part j-fold, said j being an integer equal to or greater than 2.

19. The local generator of claim 18, wherein at least said phase comparator and said voltage-controlled oscillator part are formed by a one-piece PLL-IC.

20. The local generator of claim 12, wherein said synchronized clock voltage-controlled oscillator comprises a voltage-controlled oscillator part for generating a signal of a frequency $f_{VCO}/j'$ phased-controlled by said control voltage and a j'-frequency multiplier for multiplying the output frequency of said voltage-controlled oscillator part j'-fold, said j' being an integer equal to or greater than 2.

21. The local generator of claim 20, wherein at least said synchronized clock phase comparator and said synchronized clock voltage-controlled oscillator part are formed by a one-piece PLL-IC.

22. The local generator of claim 1, wherein, letting the bit rate of said incoming optical signal pulse stream, the number of time-division multiplexed channels and the frequency of said local oscillation signal be represented by $Nf_a$, N and $f_{VCO}$, respectively, said harmonic component local generation part comprises: a first photo detector for converting said second locally generated optical pulse stream to a locally generated electric pulse stream of said frequency $f_{VCO}$; and a first frequency multiplier for multiplying h-fold the frequency of said locally generated electric pulse stream to generate said locally generated harmonic component electrical signal of a frequency $hf_{VCO}$; and said incoming signal component generation part comprises a second photo detector for converting said incoming optical signal pulse stream to said incoming signal component electrical signal of a frequency $Nf_a$, said N and h being integers equal to or greater than 1.

23. A bit-phase synchronized optical pulse stream local generator provided with a phase-locked loop comprising: a voltage-controlled oscillator; a local optical pulse source driven by the output from said voltage-controlled oscillator to locally generate an optical pulse stream; a harmonic component local generation part for generating a harmonic component electrical signal corresponding to said locally generated optical pulse stream; and a phase comparison part for comparing the phases of said locally generated harmonic component electrical signal and an electrical signal corresponding to an incoming optical signal pulse stream to generate a control voltage corresponding to their phase difference, said control voltage being provided to said voltage-controlled oscillator.

24. The local generator of claim 23, further comprising an incoming signal component generation part for generating, from said incoming optical signal pulse stream, an incoming signal component electrical signal corresponding thereto, said incoming signal component electrical signal being provided to said phase comparison part.

* * * * *